（12）United States Patent
Madan et al.

(10) Patent No.: US 9,110,483 B2
(45) Date of Patent: Aug. 18, 2015

(54) APPARATUS AND METHODS FOR VARIABLE CAPACITOR ARRAYS

(71) Applicant: Newlans, Inc., Acton, MA (US)

(72) Inventors: Anuj Madan, Cambridge, MA (US);
Dev V. Gupta, Concord, MA (US);
Zhiguo Lai, Acton, MA (US)

(73) Assignee: NEWLANS, INC., Acton, MA (US)

( * ) Notice: Subject to any disclaimer, the term of this patent is extended or adjusted under 35 U.S.C. 154(b) by 0 days.

(21) Appl. No.: 14/601,137

(22) Filed: Jan. 20, 2015

(65) Prior Publication Data

US 2015/0130532 A1    May 14, 2015

Related U.S. Application Data

(63) Continuation of application No. 14/288,115, filed on May 27, 2014, which is a continuation-in-part of application No. 14/014,496, filed on Aug. 30, 2013, now Pat. No. 9,019,007.

(60) Provisional application No. 61/857,446, filed on Jul. 23, 2013, provisional application No. 61/828,107, filed on May 28, 2013.

(51) Int. Cl.
*H03B 1/00* (2006.01)
*H03K 5/00* (2006.01)
(Continued)

(52) U.S. Cl.
CPC .............. *G05F 3/16* (2013.01); *H01L 27/1203* (2013.01); *H01L 29/94* (2013.01)

(58) Field of Classification Search
CPC ............. H01G 7/00; H01G 7/06; H01G 5/00; H03H 2210/025; H03H 21/0007; H03J 2200/39

USPC ......... 327/535, 536, 553, 554, 564, 565, 493, 327/503–505, 427, 419; 361/277, 281, 280, 361/278; 307/109

See application file for complete search history.

(56) References Cited

U.S. PATENT DOCUMENTS 4,878,151 A    10/1989  Gallichio
5,208,597 A     5/1993  Early et al.
(Continued)

FOREIGN PATENT DOCUMENTS

EP        0581702        2/1994
JP        S63 308366     12/1988
(Continued)

OTHER PUBLICATIONS

PCT Search Report of Jun. 5, 2014, for International Application No. PCT/US2014/018673, filed Feb. 26, 2014. 18 pages.
(Continued)

*Primary Examiner* — Lincoln Donovan
*Assistant Examiner* — Thomas Skibinski
(74) *Attorney, Agent, or Firm* — Knobbe Martens Olson & Bear LLP

(57) ABSTRACT

Apparatus and methods for variable capacitor arrays are provided herein. In certain configurations, an apparatus includes a variable capacitor array and a bias voltage generation circuit. The variable capacitor array includes a plurality of metal oxide semiconductor (MOS) variable capacitor cells, which include one or more pairs of MOS capacitors implemented in anti-parallel and/or anti-series configurations. In certain implementations, the MOS variable capacitor cells are electrically connected in parallel with one another between a radio frequency (RF) input and an RF output of the variable capacitor array. The bias voltage generation circuit generates bias voltages for biasing the MOS capacitors of the MOS variable capacitor cells.

29 Claims, 11 Drawing Sheets

(51) Int. Cl.
   *H01G 5/00* (2006.01)
   *H01G 7/00* (2006.01)
   *G05F 3/16* (2006.01)
   *H01L 27/12* (2006.01)
   *H01L 29/94* (2006.01)

(56) References Cited

U.S. PATENT DOCUMENTS

| | | | |
|---|---|---|---|
| 5,452,178 A | 9/1995 | Emesh et al. | |
| 6,211,745 B1 | 4/2001 | Mucke et al. | |
| 6,222,221 B1 | 4/2001 | Hou et al. | |
| 6,351,020 B1 | 2/2002 | Tarabbia et al. | |
| 6,410,954 B1 | 6/2002 | Sowlati et al. | |
| 6,657,509 B1 | 12/2003 | Ohannes | |
| 6,765,778 B1 | 7/2004 | Du et al. | |
| 6,885,081 B2 | 4/2005 | Morimoto | |
| 7,000,000 B1 | 2/2006 | O'Brien et al. | |
| 7,245,519 B2 | 7/2007 | McQuirk et al. | |
| 7,251,121 B2 | 7/2007 | Bhutta | |
| 7,280,001 B2 | 10/2007 | Maligeorgos et al. | |
| 7,408,422 B2 * | 8/2008 | Dedieu et al. | 331/177 V |
| 7,453,136 B2 | 11/2008 | Hakkarainen | |
| 8,134,222 B2 | 3/2012 | Khan et al. | |
| 8,324,069 B1 | 12/2012 | Carns et al. | |
| 8,395,880 B2 | 3/2013 | Wasson | |
| 8,531,862 B2 | 9/2013 | Roest et al. | |
| 9,019,007 B2 | 4/2015 | Gupta et al. | |
| 2002/0140115 A1 * | 10/2002 | Inoh et al. | 257/797 |
| 2004/0066244 A1 | 4/2004 | Takinami et al. | |
| 2005/0030116 A1 | 2/2005 | Takagi | |
| 2005/0184812 A1 | 8/2005 | Cho | |
| 2006/0125121 A1 * | 6/2006 | Ko et al. | 257/900 |
| 2008/0048236 A1 | 2/2008 | Kim | |
| 2008/0197923 A1 | 8/2008 | Nakajima et al. | |
| 2009/0096507 A1 | 4/2009 | Gao et al. | |
| 2009/0128992 A1 | 5/2009 | Haralabiois | |
| 2009/0243743 A1 | 10/2009 | Kossel et al. | |
| 2009/0325521 A1 * | 12/2009 | Dubash et al. | 455/150.1 |
| 2010/0052778 A1 | 3/2010 | Baranauskas | |
| 2011/0002080 A1 | 1/2011 | Ranta | |
| 2011/0109380 A1 | 5/2011 | Park et al. | |
| 2011/0121910 A1 | 5/2011 | Yang et al. | |
| 2011/0298526 A1 | 12/2011 | Homol et al. | |
| 2012/0211868 A1 | 8/2012 | Stribley et al. | |
| 2014/0009211 A1 | 1/2014 | Madan et al. | |
| 2014/0062575 A1 | 3/2014 | Hurwitz | |
| 2014/0354348 A1 | 12/2014 | Gupta et al. | |
| 2014/0355172 A1 | 12/2014 | Gupta et al. | |

FOREIGN PATENT DOCUMENTS

| | | |
|---|---|---|
| JP | 2006128468 | 5/2006 |
| WO | WO 2013-028546 A1 | 2/2013 |

OTHER PUBLICATIONS

Sauerbrey J., et al., "A 0.7-V MOSFET-Only Switched-OPAMP SIGMADELTA Modulator in Standard Digital CMOS Technology", IEEE Journal of Solid-State Circuits, vol. 37, No. 12, Dec. 2002, pp. 1662-1669, XP001222721, section II.C, first paragraph; figures 1,2.
Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999, XP011018608, abstract; figure 4.
Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97, XP001221090, section 1, third paragraph.
Pietro Andreani et al: "On the Use of MOS Varactors in RF VCO's", IEEE Journal of Solid-State Circuits, vol. 35, No. 6, Jun. 2000, XP011061254, sections II, III; figures 1-5.
Kampe, A et al., "An LC-VCO with one octave tuning range," IEEE European Conference on Circuit Theory and Design, vol. 3, Aug. 29, 2005, pp. 321-324.
Nakamura, T et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.
Invitation to Pay Additional Fees with Communication Relating to the Results of the Partial International Search mailed Aug. 12, 2014 in counterpart International Application No. PCT/US2014/039599 in 10 pages.
International Search Report and Written Opinion dated Nov. 13, 2014 for International Application No. PCT/US2014/039599, filed on May 27, 2014. 25 pages.
Zhiqiang et al., "A Multi-Band RF CMOS LC Bandpass Filter with Continuous Frequency Tuning Design." 2010 International Conference on Computer Application and System Modeling (ICCASM 2010). 4 pages.

* cited by examiner

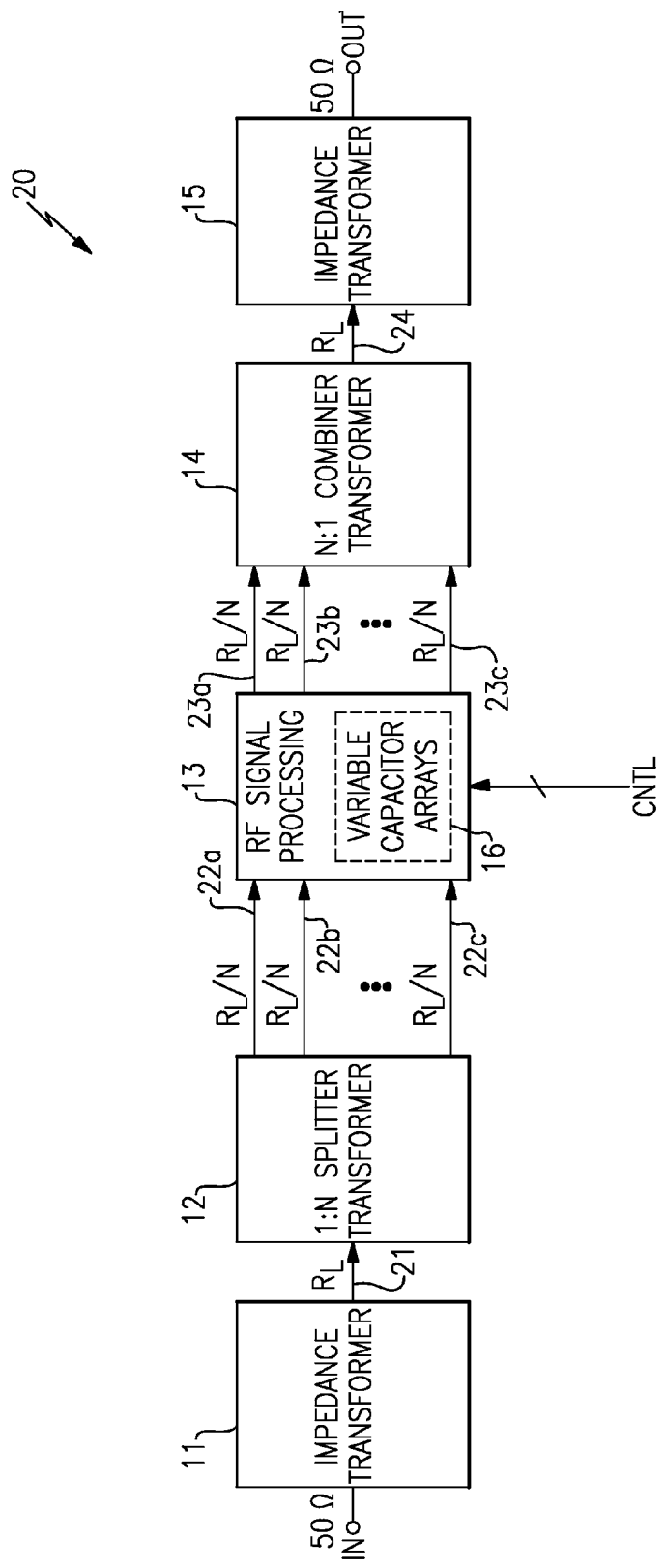

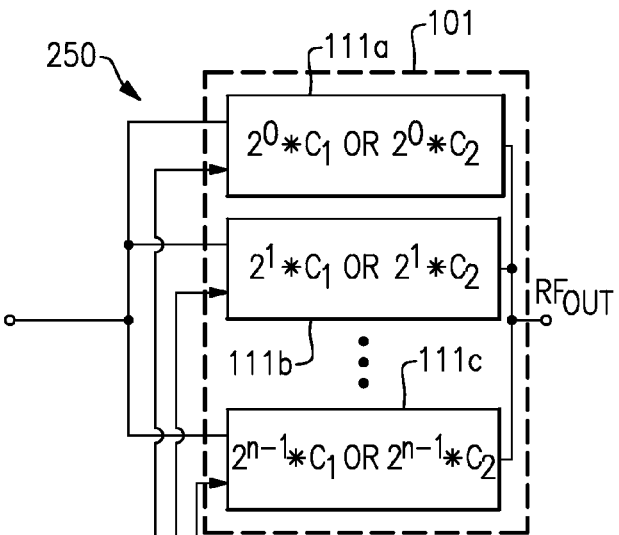
FIG.11A
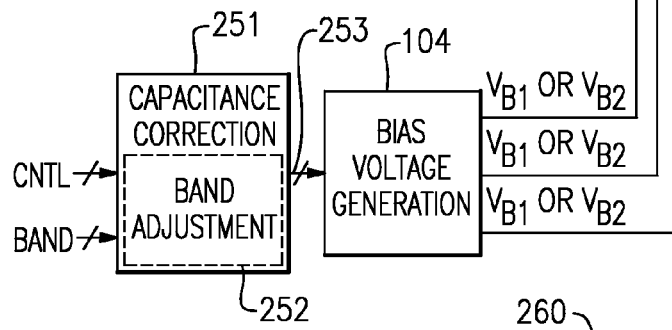
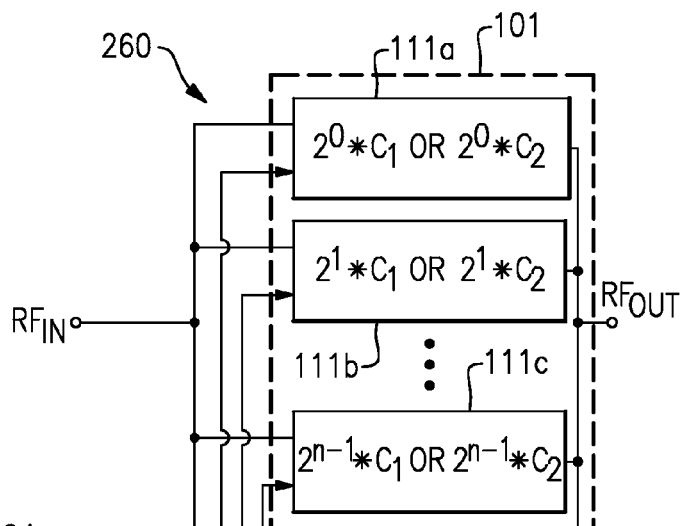
FIG.11B
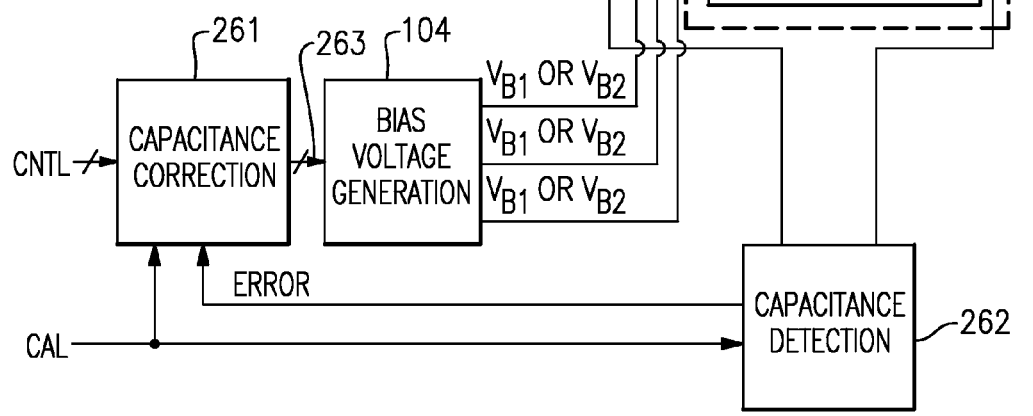

APPARATUS AND METHODS FOR VARIABLE CAPACITOR ARRAYS

CROSS-REFERENCE TO RELATED APPLICATIONS

This application is a continuation of commonly-owned U.S. patent application Ser. No. 14/288,115, filed May 27, 2014, titled "APPARATUS AND METHODS FOR VARIABLE CAPACITOR ARRAYS", which is a continuation-in-part of commonly-owned U.S. patent application Ser. No. 14/014,496, filed Aug. 30, 2013, titled "HIGH LINEARITY VARIABLE CAPACITOR ARRAY", which claims the benefit of priority under 35 U.S.C. §119(e) of U.S. Provisional Patent Application No. 61/857,446, filed Jul. 23, 2013 titled "SIGNAL HANDLING APPARATUS FOR RADIO FREQUENCY CIRCUITS", and of U.S. Provisional Patent Application No. 61/828,107, filed May 28, 2013 titled "TUNABLE PASSIVE FILTER COMPONENTS", each of which is hereby incorporated by reference in their entireties herein.

BACKGROUND

1. Field

Embodiments of the invention relate to electronic systems and, in particular, to variable capacitor arrays for radio frequency (RF) circuits.

2. Description of the Related Technology

A capacitor can include a pair of conductors separated by a dielectric. When a voltage is applied between the pair of conductors, an electric field can develop across the dielectric, which can lead to a store of charge in the capacitor. The capacitance of a capacitor corresponds to a ratio of the charge stored to a voltage difference between the conductors. Other parameters, such as quality factor (Q), frequency response, and/or linearity, can also be important in selecting a capacitor that is appropriate for a particular application.

Capacitors can be used in a variety of types of analog and radio frequency (RF) circuits. For example, capacitors can be included in filters, duplexers, resonators, tuners, and/or other circuitry.

SUMMARY

In one aspect, an integrated circuit includes a first variable capacitor array and a bias voltage generation circuit. The first variable capacitor array includes a first plurality of metal oxide semiconductor (MOS) variable capacitor cells. The first plurality of MOS variable capacitor cells includes a first MOS variable capacitor cell including a first MOS capacitor and a second MOS capacitor. The first MOS capacitor and the second MOS capacitor are arranged in an anti-series configuration or in an anti-parallel configuration. The bias voltage generation circuit is configured to bias the first plurality of MOS variable capacitor cells including the first MOS variable capacitor cell to control a capacitance of the first variable capacitor array.

In another aspect, a method of biasing a variable capacitor array is provided. The method includes generating a first bias voltage using a bias voltage generation circuit, selecting a voltage level from a discrete number of two or more bias voltage levels based on a control signal, controlling the first bias voltage to the selected voltage level using the bias voltage generation circuit, and biasing a first metal oxide semiconductor (MOS) variable capacitor cell using the bias signal. The first MOS variable capacitor cell includes a first MOS capacitor and a second MOS capacitor arranged in an anti-series configuration or in an anti-parallel configuration. Biasing the first MOS variable capacitor cell using the first bias voltage includes applying the first bias voltage between an anode and a cathode of the first MOS capacitor and applying the first bias voltage between an anode and a cathode of the second MOS capacitor.

In another aspect, an apparatus is provided. The apparatus includes a radio frequency (RF) signal processing circuit including a plurality of variable capacitor arrays including a first variable capacitor array. The first variable capacitor array includes a first plurality of metal oxide semiconductor (MOS) variable capacitor cells, and the first plurality of MOS variable capacitor cells includes a first MOS variable capacitor cell comprising a first MOS capacitor and a second MOS capacitor. The first MOS capacitor and the second MOS capacitor are arranged in an anti-series configuration or in an anti-parallel configuration. The first variable capacitor array further includes a bias voltage generation circuit configured to bias the first plurality of MOS variable capacitor cells to control a capacitance of the first variable capacitor array.

BRIEF DESCRIPTION OF THE DRAWINGS

FIG. 2 is a schematic diagram of a programmable filter according to one embodiment.

FIG. 11A is a schematic diagram of an IC according to another embodiment.

FIG. 11B is a schematic diagram of an IC according to another embodiment.

DETAILED DESCRIPTION OF EMBODIMENTS

Figure 1:
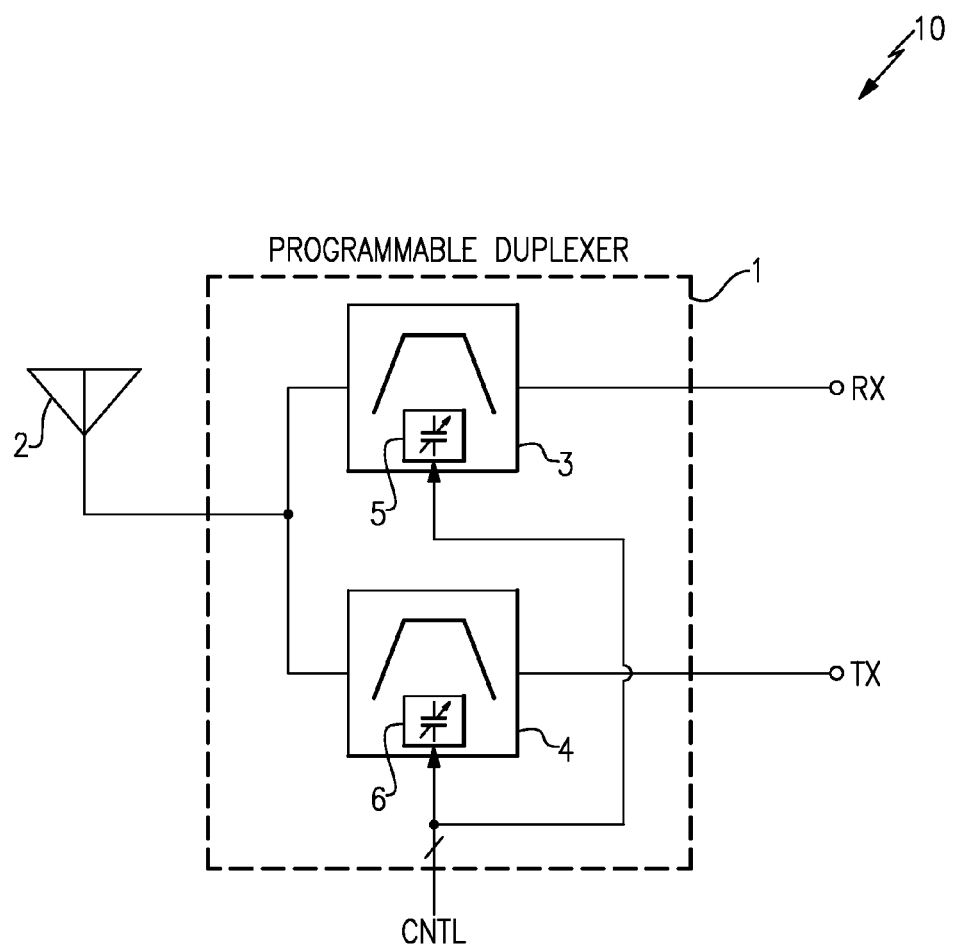
FIG. 1 is a schematic diagram of one embodiment of a radio frequency (RF) system.

The following detailed description of certain embodiments presents various descriptions of specific embodiments of the invention. However, the invention can be embodied in a multitude of different ways as defined and covered by the claims.

In this description, reference is made to the drawings where like reference numerals may indicate identical or functionally similar elements.

Apparatus and methods for variable capacitor arrays are provided herein. In certain configurations, an apparatus includes a variable capacitor array and a bias voltage generation circuit. The variable capacitor array can include a plurality of metal oxide semiconductor (MOS) variable capacitor cells, which include one or more pairs of MOS capacitors implemented in anti-parallel and/or anti-series configurations. In certain implementations, the MOS variable capacitor cells are electrically connected in parallel with one another between a radio frequency (RF) input and an RF output of the variable capacitor array. The bias voltage generation circuit generates bias voltages for biasing the MOS capacitors of the MOS variable capacitor cells.

A MOS capacitor can include a gate that operates as an anode, and a source and drain that are electrically connected to one another and operate as a cathode. Additionally, a DC bias voltage between the MOS capacitor's anode and cathode can be used to control the MOS capacitor's capacitance. In certain configurations, a MOS variable capacitor cell includes one or more pairs of MOS capacitors implemented in anti-parallel and/or anti-series configurations. As used herein, a pair of MOS capacitors can be electrically connected in an anti-parallel or inverse parallel configuration in which an anode of the first MOS capacitor is electrically connected to a cathode of the second MOS capacitor, and a cathode of the first MOS capacitor is electrically connected to an anode of the second MOS capacitor. Additionally, a pair of MOS capacitors can be electrically connected in an anti-series or inverse series configuration in which the pair of MOS capacitors are electrically connected in series with the first and second MOS capacitors' anodes electrically connected to one another or with the first and second MOS capacitors' cathodes electrically connected to one another. These configurations will be described in greater detail later in connection with FIGS. 7A-7D.

In certain configurations, the bias voltage generation circuit can bias the MOS capacitors of a particular MOS variable capacitor cell at a voltage level selected from discrete number of two or more bias voltage levels associated with high linearity. Thus, rather than biasing the MOS capacitors at a bias voltage level selected from a continuous tuning voltage range, the bias voltage generation circuit generates the MOS capacitors' bias voltages by selecting a particular cell's bias voltage level from a discrete set of bias voltage levels associated with high linearity. In one embodiment, the bias voltage generation circuit biases a particular MOS capacitor either at a first bias voltage level associated with an accumulation mode of the MOS capacitor or at a second bias voltage level associated an inversion mode of the MOS capacitor.

As used herein and as persons having ordinary skill in the art will appreciate, the terms MOS capacitors or MOS variable capacitors refer to any types of capacitors made from insulated gates. These MOS capacitors or MOS variable capacitors can have gates made from metals, such as aluminum, and dielectric regions made out of silicon oxide. However, these MOS capacitors or MOS variable capacitors can alternatively have gates made out of materials that are not metals, such as poly silicon, and can have dielectric regions implemented not just with silicon oxide, but with other dielectrics, such as high-k dielectrics.

In certain embodiments, a variable capacitor array omits any switches in the signal path between the variable capacitor array's RF input and RF output. Switches can introduce insertion loss, degrade Q-factor, and/or decrease linearity. Thus, rather than providing capacitance tuning by opening and closing switches to set a number of active capacitors from a capacitor bank, capacitance tuning can be provided by biasing MOS capacitors of the MOS variable capacitor cells at different bias voltage levels to provide a desired overall capacitance of the variable capacitor array. In certain configurations, the MOS variable capacitors cells of the variable capacitor array can have the same or different weights or sizes, and the variable capacitor array's overall capacitance is based on a linear combination of the capacitances of the MOS variable capacitor cells.

The variable capacitor arrays disclosed herein can have a relatively small size, a relatively high Q, a relatively high linearity, and/or a relatively low insertion loss. Furthermore, in certain implementations, a variable capacitor array can provide sufficient tuning range to provide filtering across a variety of different frequency bands. Accordingly, the variable capacitor array may be used to provide frequency tuning in a wide range of RF electronics, including, for example, programmable filters, programmable resonators, programmable antenna tuners, programmable impedance matching networks, programmable phase shifters, and/or programmable duplexers.

FIG. 1 is a schematic diagram of one embodiment of a radio frequency (RF) system 10. The RF system 10 includes a programmable duplexer 1, an antenna 2, a receive terminal RX, and a transmit terminal TX. The RF system 10 can represent a portion of a wireless device, such as a smart phone. Accordingly, although not illustrated in FIG. 1 for clarity, the RF system 10 can include additional components and/or circuitry.

As shown in FIG. 1, the programmable duplexer 1 includes a first programmable filter 3 and a second programmable filter 4. The first programmable filter 3 includes an input electrically connected to the antenna 2 and an output electrically connected to the receive terminal RX. The first programmable filter 3 further includes a first variable capacitor structure 5, which can be used to control a filtering characteristic of the first programmable filter 3, such as the location in frequency of a passband. The second programmable filter 4 includes an input electrically connected to the transmit terminal TX and an output electrically connected to the antenna 2. The second programmable filter 4 further includes a second variable capacitor structure 6, which can be used to control a filtering characteristic of the second programmable filter 4.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

Certain conventional wireless devices can include a multi-throw switch and a duplexer associated with each of the frequency bands, and the multi-throw switch can be used to selectively couple an antenna to a duplexer associated with a particular band. The duplexers can provide band filtering using, for example, passive filtering structures, such as a surface acoustic wave (SAW) filters and/or thin film bulk acoustic resonators (FBARs). The multi-throw switch can be used to electrically couple the antenna to a duplexer associated with a frequency band that the wireless device is transmitting and/or receiving over at a particular time instance.

In the illustrated configuration, the programmable duplexer 1 can be configured to filter a particular frequency band by programming the first and second programmable filters 3, 4 using a control signal CNTL. For example, in certain embodiments, the capacitance value of the first variable capacitor structure 5 can be controlled using the control signal CNTL to control a frequency location of a passband of the first programmable filter 3, and the capacitance value of the second variable capacitor structure 6 can be controlled using the control signal CNTL to control a frequency location of a passband of the second programmable filter 4.

Accordingly, the programmable duplexer 1 can be used to provide the RF system 10 with multi-band capability, while avoiding a need for using a multi-throw switch and a duplexer for each frequency band. Including the programmable duplexer 1 in the RF system 10 can reduce insertion loss in transmit and/or receive paths by eliminating a need for a multi-throw switch. Furthermore, the programmable duplexer 1 can have smaller area relative to a configuration including a multi-throw switch and multiple duplexers. Thus, a wireless device that includes the programmable duplexer 1 can have a smaller form factor and/or lower cost.

In the illustrated configuration, the capacitance values of the first and second variable capacitor structures 5, 6 can be controlled using the control signal CNTL. In one embodiment, the control signal CNTL is received by the programmable duplexer 1 over an interface, such as a serial peripheral interface (SPI) or Mobile Industry Processor Interface radio frequency front end (MIPI RFFE) interface. Although two examples of interfaces have been provided, other interfaces can be used. Although FIG. 1 illustrates the first and second variable capacitor structures 5, 6 as receiving a common control signal CNTL, other configurations are possible, such as implementations in which the first and second variable capacitor structures 5, 6 are controlled using separate control signals.

In certain configurations, the first variable capacitor structure 5 and/or the second variable capacitor structure 6 are implemented using one or more of the variable capacitor arrays described herein.

In one embodiment, the first and second variable capacitor structures 5, 6 are implemented using variable capacitor arrays that include metal oxide semiconductor (MOS) capacitors, which can offer enhanced performance over certain other tunable capacitance structures. For instance, certain microelectromechanical systems (MEMS) capacitors can exhibit low Q-factor, poor reliability, and/or limited tuning range. Additionally, other approaches such as coupled resonators can suffer from large size and/or cost, and thus can be unsuitable for certain applications, including smart phones.

Although the RF system 10 illustrates one example of a system that can include one or more variable capacitor arrays, the variable capacitor arrays described herein can be used in other systems.

FIG. 2 is a schematic diagram of a programmable filter 20 according to one embodiment. The programmable filter 20 includes an input impedance transformer 11, a splitter transformer 12, an RF signal processing circuit 13, a combiner transformer 14, and an output impedance transformer 15. The programmable filter 20 further includes an RF input IN and an RF output OUT.

The programmable filter 20 illustrates one embodiment of a programmable filter suitable for implementing the first and/or second programmable filters 3, 4 shown in FIG. 1. However, the programmable filter 20 can be used in other systems and/or the first and/or second programmable filters 3, 4 can be implemented in other ways.

The input impedance transformer 11 can receive an RF input signal on the RF input IN, and can generate an impedance transformed signal 21. The input impedance transformer 11 can provide an impedance transformation from input to output. For example, in one embodiment, the input impedance transformer 11 transforms an input impedance of about 50Ω to an output impedance of about $R_L$, where $R_L$ is less than 50Ω, for example, 8Ω.

Transforming the input impedance of the programmable filter 20 in this manner can result in the impedance transformed signal 21 having a smaller voltage level relative to a voltage level of the RF input signal received at the RF input IN. For example, when the programmable filter 20 has an input impedance of about 50Ω, the voltage level of the impedance transformed signal 21 can be smaller than the voltage level of the RF input signal by a factor of about $\sqrt{50/R_L}$.

The splitter transformer 12 can receive the impedance transformed signal 21 from the input impedance transformer 11, and can generate N split signals, where N is an integer greater than or equal to 2. In the illustrated configuration, the splitter transformer 12 generates a first split signal 22a, a second split signal 22b, and a third split signal 22c. Although an example with N=3 has been illustrated, the principles and advantages disclosed herein are applicable to a broad range of values for the integer N, including 2, 3, 4, 5, or 6 or more.

Splitting the impedance transformed signal 21 into N split signals can further decrease a voltage level of the RF input signal by a factor of N. Including the splitter transformer 12 can also reduce the impedance by a factor of N. For example, when the output impedance of the input impedance transformer 11 has a value of $R_L$, the output impedance of each output of the splitter transformer 12 can have a value of $R_L/N$.

As shown in FIG. 2, the RF signal processing circuit 13 can receive the first, second, and third split signals 22a-22c, and can generate first, second, and third processed RF signals 23a-23c, respectively. As illustrated in FIG. 2, the RF signal processing circuit 13 includes variable capacitor arrays 16, which can be used to control a filtering characteristic of the RF signal processing circuit 13. The RF signal processing circuit 13 further receives a control signal CNTL, which can be used to control the capacitances of the variable capacitor arrays 16.

The illustrated RF signal processing circuit 13 can be used to process the split signals 22a-22c generated by the splitter transformer 12 to generate the processed signals 23a-23c, respectively. In certain configurations, the RF signal processing circuit 13 can include substantially identical circuitry in the signal paths between the RF signal processing circuit's inputs and outputs.

The combiner transformer 14 receives the processed signals 23a-23c, which the combiner transformer 14 can combine to generate a combined signal 24. The combiner transformer 14 can also provide an impedance transformation. For example, in a configuration in which each output of the RF signal processing circuit 13 has an output impedance of about $R_L/N$, the combiner transformer 14 can have an output impedance of about $R_L$.

The output impedance transformer 15 receives the combined signal 24 from the combiner transformer 14, and generates the RF output signal on the RF output OUT. In certain configurations, the combiner transformer 14 can have an output impedance $R_L$ that is less than 50Ω, and the output impedance transformer 15 can be used to provide the RF output signal at an output impedance of about 50Ω.

The illustrated programmable filter 20 provides filtering using the RF signal processing circuit 13, which processes the split signals 22a-22c at lower impedance relative to the programmable filter's input impedance. Thereafter, the processed signals 23a-23c are combined and transformed up in impedance. For example, in one embodiment, the programmable filter's output impedance is about equal to the programmable filter's input impedance.

Configuring the programmable filter 20 to process an RF input signal in this manner can increase the programmable filter's voltage handling capability. For example, when the programmable filter 20 has an input impedance of about 50Ω, the voltage level of the RF input signal can be decreased by a factor of about $\sqrt{50/R_L}$ before it is provided to the RF signal processing circuit 13, which may include circuitry that is sensitive to high voltage conditions. Accordingly, the illustrated programmable filter 20 can be used to process high voltage RF input signals and/or can have enhanced robustness to variations in voltage standing wave ratio (VWSR).

Furthermore, configuring the programmable filter 20 to process the RF signal at lower impedance can enhance the programmable filter's linearity. —In one embodiment, the illustrated configuration can reduce the third-order intermodulation distortion (IMD3) by a factor of about $40 \log_{10} N \sqrt{50/R_L}$ relative to a configuration in which an RF input signal is provided directly to an RF signal processing circuit without impedance transformation or splitting. In one illustrative example, N can be selected to be equal to 8 and $R_L$ can be selected to be about equal to about 8Ω, and the programmable filter can provide a linearity improvement of about 52 dB. However, other configurations are possible.

Figure 3A:
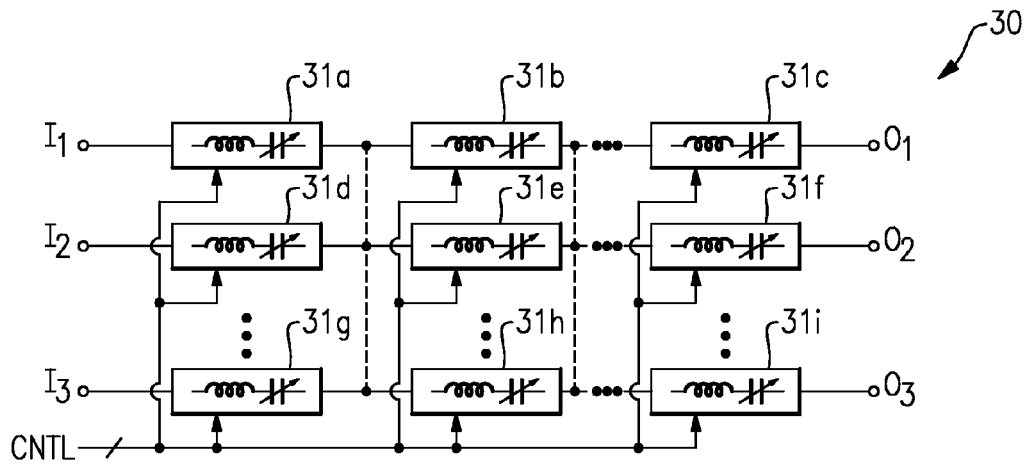
FIG. 3A is a schematic diagram of one embodiment of an RF signal processing circuit.

FIG. 3A is a schematic diagram of one embodiment of an RF signal processing circuit 30. The RF signal processing circuit 30 includes a first inductor-capacitor (LC) circuit 31a, a second LC circuit 31b, a third LC circuit 31c, a fourth LC circuit 31d, a fifth LC circuit 31e, a sixth LC circuit 31f, a seventh LC circuit 31g, an eighth LC circuit 31h, and a ninth LC circuit 31i. The RF signal processing circuit 30 illustrates one embodiment of the RF signal processing circuit 13 of FIG. 2.

As shown in FIG. 3A, the first, second, and third LC circuits 31a-31c are arranged in a cascade between a first RF input $I_1$ and a first RF output $O_1$. Additionally, the fourth, fifth, and sixth LC circuits 31d-31f are arranged in a cascade between a second RF input $I_2$ and a second RF output $O_2$. Furthermore, the seventh, eighth, and ninth LC circuits 31g-31i are arranged in a cascade between a third RF input $I_3$ and a third RF output $O_3$.

Although FIG. 3A illustrates a configuration including three RF inputs and three RF outputs, the RF signal processing circuit 30 can be adapted to include more or fewer inputs and outputs.

The RF signal processing circuit 30 can be used to process RF input signals received on the first to third RF inputs $I_1$-$I_3$ to generate RF output signals on the first to third RF outputs $O_1$-$O_3$. As shown in FIG. 3A, the RF signal processing circuit 30 receives a control signal CNTL, which can be used to control a variable capacitance associated with the first to ninth LC circuits 31a-31i. By controlling the LC circuits' capacitances, the control signal CNTL can be used to tune a frequency response of the RF signal processing circuit 30.

In one embodiment, the RF signal processing circuit 30 is configured to operate as a band pass filter, and the control signal CNTL can be used to control a location in frequency of the band pass filter's passband. However, other configurations are possible.

Although FIG. 3A illustrates a configuration including three LC circuits arranged in a cascade between each input and output, more or fewer LC circuits and/or other processing circuitry can be included.

Cascading LC circuits can increase a voltage handling capability of an RF signal processing circuit by limiting a voltage drop across individual circuit components of the LC circuits. For example, in certain implementations, the LC circuits 31a-31i are implemented using MOS capacitors, which can be damaged by large gate-to-drain and/or gate-to-source voltages. By arranging two or more LC circuits in a cascade, a voltage drop across the MOS capacitors during operation can be increased relative to a configuration including a single LC circuit between a particular input and output.

The RF signal processing circuit 30 illustrates one embodiment of the RF signal processing circuit 13 of FIG. 2. For example, in certain configurations, the first to third input RF inputs $I_1$-$I_3$ can receive the first to third RF split signals 22a-22c, respectively, and the first to third RF outputs $O_1$-$O_3$ can generate the first to third processed signals 23a-23c, respectively.

The RF signal processing circuit 30 includes a first signal path between the first RF input $I_1$ and the first RF output $O_1$, a second signal path between the second RF input $I_2$ and the second RF output $O_2$, and a third signal path between the third RF input $I_3$ and the third RF output $O_3$. In certain configurations, one or more electrical connections can be provided between corresponding positions along the first to third signals paths. For example, in certain implementations, the RF signal processing circuit 30 is used to process substantially identical RF input signals received on the first to third RF inputs $I_1$-$I_3$, respectively, to generate substantially identical RF output signals on the first to third RF outputs $O_1$-$O_3$. In such configurations, electrical connections can be provided along corresponding positions of signal paths, since the corresponding positions should have substantially the same voltage level. Examples of such electrical connections are illustrated in FIG. 3A with dashed lines.

Figure 3B:
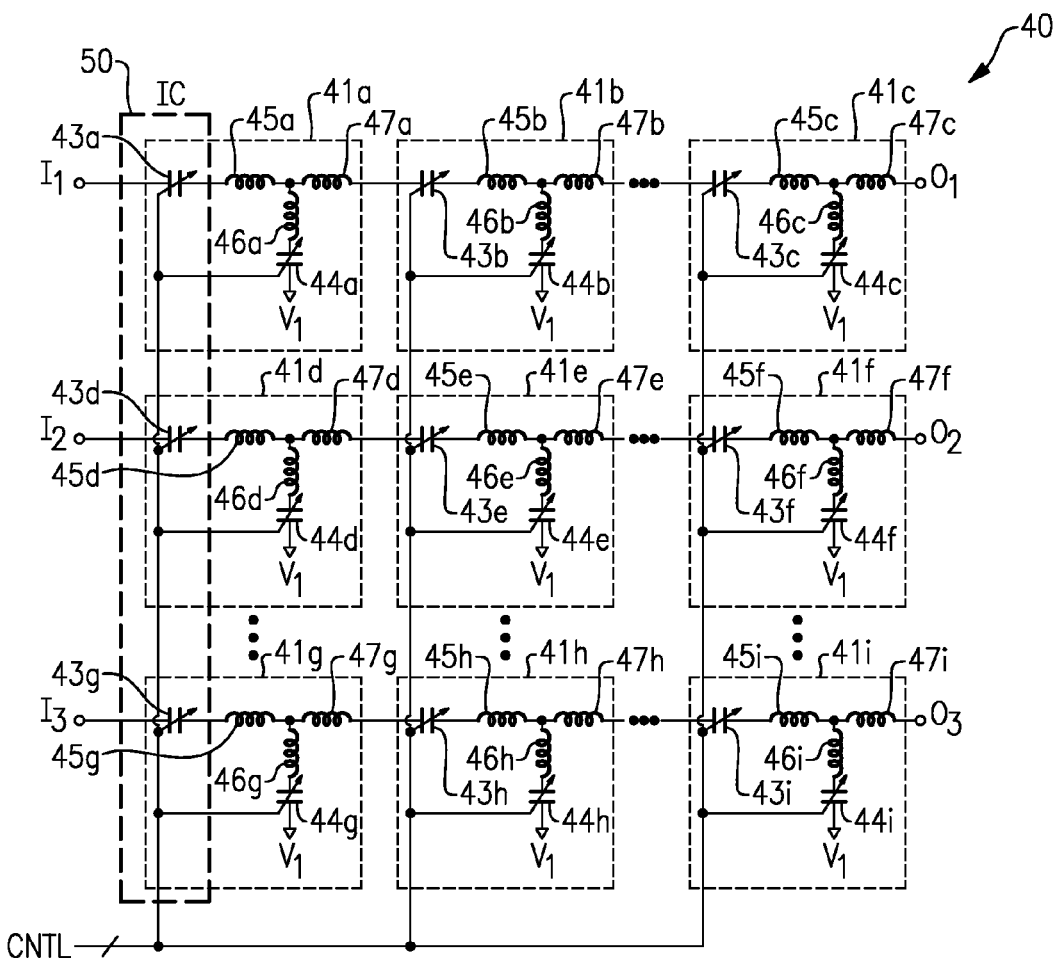
FIG. 3B is a schematic diagram of another embodiment of an RF signal processing circuit.

FIG. 3B is a schematic diagram of another embodiment of an RF signal processing circuit 40. The RF signal processing circuit 40 includes a first LC circuit 41a, a second LC circuit 41b, a third LC circuit 41c, a fourth LC circuit 41d, a fifth LC circuit 41e, a sixth LC circuit 41f, a seventh LC circuit 41g, an eighth LC circuit 41h, and a ninth LC circuit 41i.

The first to ninth LC circuits 41a-41i each include an input and an output. The first, second, and third LC circuits 41a-41c are arranged in a cascade between the first RF input $I_1$ and the first RF output $O_1$. Additionally, the fourth, fifth, and sixth LC circuits 41d-41f are arranged in a cascade between the second RF input $I_2$ and second RF output $O_2$. Furthermore, the seventh, eighth, and ninth LC circuits are arranged in a cascade between the third RF input $I_3$ and the third RF output $O_3$.

The first LC circuit 41a includes a first variable capacitor 43a, a second variable capacitor 44a, a first inductor 45a, a second inductor 46a, and a third inductor 47a. The first variable capacitor 43a includes a first end electrically connected to the input of first LC circuit 41a, and a second end electrically connected to a first end of the first inductor 45a. The first inductor 45a further includes a second end electrically connected to a first end of the second inductor 46a and to a first end of the third inductor 47a. The second variable capacitor 44a includes a first end electrically connected to a second end of the second inductor 46a and a second end electrically connected to a first voltage $V_1$, which can be, for example, a ground or power low supply. The third inductor 47a further includes a second end electrically connected to an output of the first LC circuit 41a.

The second to ninth LC circuits 41b-41i include first variable capacitors 43b-43i, second variable capacitors 44b-44i, first inductors 45b-45i, second inductors 46b-46i, and third inductors 47b-47i, respectively. Additional details of the second to ninth LC circuits 41b-41i can be similar to those described above with respect to the first LC circuit 41a.

The control signal CNTL can be used to control variable capacitances of the variable capacitors of the first to ninth LC circuits 41a-41i, thereby controlling a passband of the RF signal processing circuit 40. In certain implementations, an inductance of the first to ninth LC circuits 41a-41i is substantially fixed or constant.

In certain configurations, all or part of the variable capacitors of an RF signal processing circuit are implemented using variable capacitor arrays fabricated on one or more integrated circuits. For example, as shown in FIG. 3B, in one embodiment, the first variable capacitor 43a, the fourth variable capacitor 43d, and the seventh variable capacitor 44g are fabricated as three variable capacitor arrays on a first IC 50. Additionally, the other variable capacitors shown in FIG. 3B can be fabricated as variable capacitor arrays on the first IC 50 or on one or more additional ICs. Although one example of implementing variable capacitors as variable capacitor arrays has been described, other configurations are possible.

Figure 4:
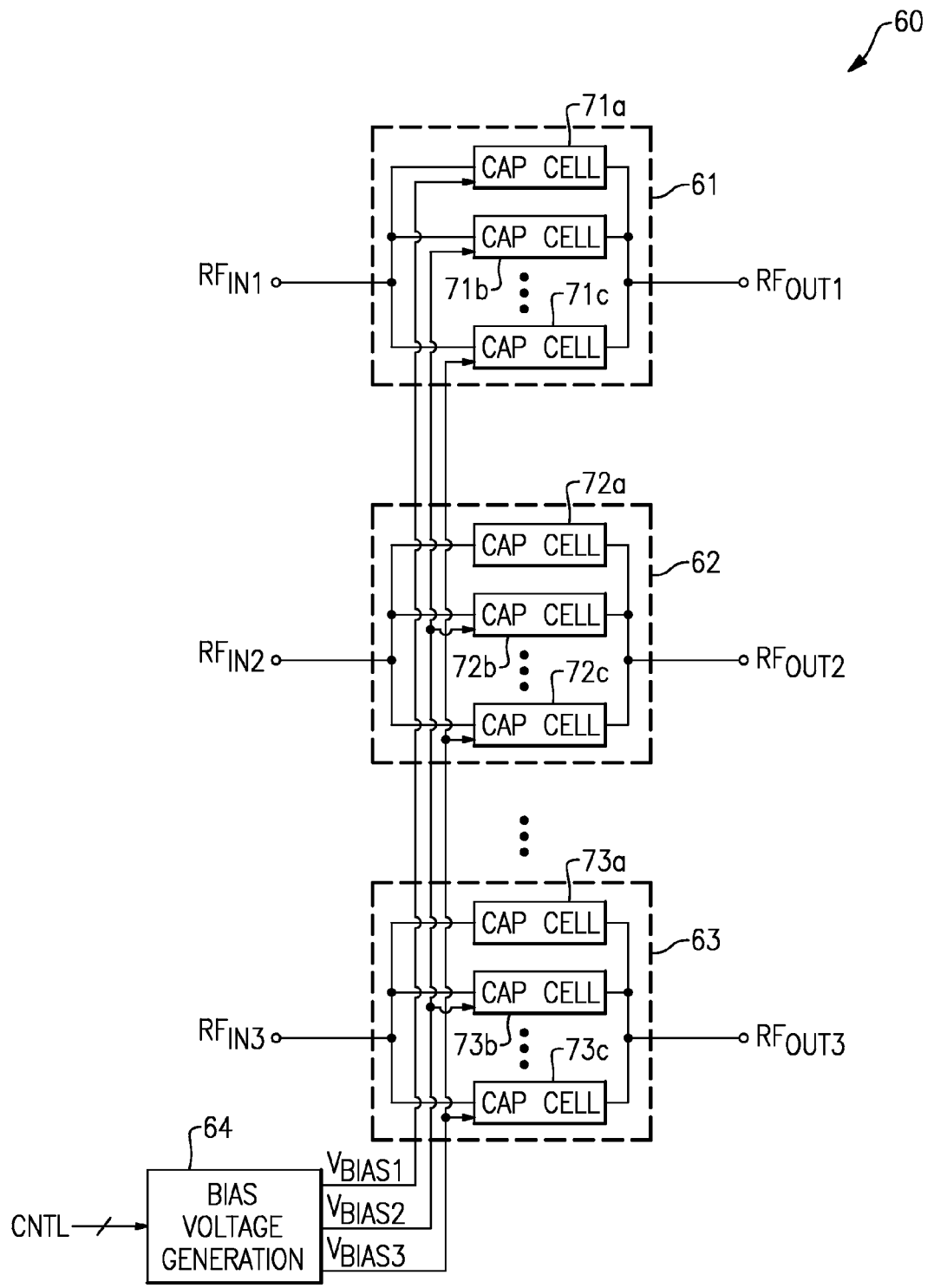
FIG. 4 is a schematic diagram of an integrated circuit (IC) according to one embodiment.

FIG. 4 is a schematic diagram of an integrated circuit (IC) 60 according to one embodiment. The IC 60 includes a first variable capacitor array 61, a second variable capacitor array 62, a third variable capacitor array 63, and a bias voltage generation circuit 64. The IC 60 includes a first RF input $RF_{IN1}$, a second RF input $RF_{IN2}$, a third RF input $RF_{IN3}$, a first RF output $RF_{OUT1}$, a second RF output $RF_{OUT2}$, and a third RF output $RF_{OUT3}$.

The first variable capacitor array 61 includes a first variable capacitor cell 71a, a second variable capacitor cell 71b, and a third variable capacitor cell 71c. The first to third capacitors cells 71a-71c are electrically connected in parallel between the first RF input $RF_{IN1}$ and the first RF output $RF_{OUT1}$. The second variable capacitor array 62 includes a first variable capacitor cell 72a, a second variable capacitor cell 72b, and a third variable capacitor cell 72c. The first to third capacitors cells 72a-72c are electrically connected in parallel between the second RF input $RF_{IN2}$ and the second RF output $RF_{OUT2}$. The third variable capacitor array 63 includes a first variable capacitor cell 73a, a second variable capacitor cell 73b, and a third variable capacitor cell 73c. The first to third capacitors cells 73a-73c are electrically connected in parallel between the third RF input $RF_{IN3}$ and the third RF output $RF_{OUT3}$.

Although FIG. 4 illustrates the IC 60 as including three variable capacitor arrays, the IC 60 can be adapted to include more or fewer variable capacitor arrays. In other embodiments, the IC 60 can include between about 4 and about 16 variable capacitor arrays. However, other configurations are possible.

Additionally, although FIG. 4 illustrates each variable capacitor array as including three variable capacitor cells, the variable capacitor arrays can be adapted to include more or fewer variable capacitor cells. In one embodiment the IC 60 includes between about 6 and about 12 variable capacitor cells. However, a variable capacitor array can be adapted to include other numbers of variable capacitor cells.

The bias voltage generation circuit 64 receives the control signal CNTL, and generates a first bias voltage $V_{BIAS1}$, a second bias voltage $V_{BIAS2}$, and a third bias voltage $V_{BIAS3}$. As shown in FIG. 4, the first bias voltage $V_{BIAS1}$ is provided to the first variable capacitor cell 71a of the first variable capacitor array 61, to the first variable capacitor cell 72a of the second variable capacitor array 62, and to the first variable capacitor cell 73a of the third variable capacitor array 63. Additionally, the second bias voltage $V_{BIAS2}$ is provided to the second variable capacitor cell 71b of the first variable capacitor array 61, to the second variable capacitor cell 72b of the second variable capacitor array 62, and to the second variable capacitor cell 73b of the third variable capacitor array 63. Furthermore, the third bias voltage $V_{BIAS3}$ is provided to the third variable capacitor cell 71c of the first variable capacitor array 61, to the third variable capacitor cell 72c of the second variable capacitor array 62, and to the third variable capacitor cell 73c of the third variable capacitor array 63.

The bias voltage generation circuit 64 can be used to control the voltage levels of the first, second, and third bias voltages $V_{BIAS1}$-$V_{BIAS3}$ to control the capacitances of the first to third variable capacitor arrays 61-63.

In one embodiment, the illustrated variable capacitor cells are implemented using MOS transistors. Additionally, the first to third bias voltages $V_{BIAS1}$-$V_{BIAS3}$ can be used to bias the MOS transistors at two or more bias voltages associated with a small amount of capacitance variation, and thus with high linearity. For example, in one embodiment, the first to third bias voltages $V_{BIAS1}$-$V_{BIAS3}$ can be controlled to bias the MOS capacitors in accumulation or inversion to control the overall capacitance of the arrays.

In certain configurations, the MOS capacitors can be fabricated using a complementary metal oxide semiconductor (CMOS) processes, such as deep sub-micron (DSM) CMOS processes. However, other configurations are possible, including, for example, implementations in which the MOS capacitors are fabricated using silicon on insulator (SOI) processes.

In certain configurations herein, a variable capacitor cell can include one or more pairs of MOS capacitors implemented using anti-parallel and/or anti-series configurations. Configuring a variable capacitor cell in this manner can help reduce a variation in the cell's capacitance in the presence of RF signals.

As shown in FIG. 4, the bias voltage generation circuit 64 receives the control signal CNTL, which can be used to select the voltage levels of the first, second, and third bias voltages $V_{BIAS1}$-$V_{BIAS3}$. In certain configurations, each of the variable capacitor arrays 61-63 includes weighted banks of capacitors cells. For example, in one embodiment, the first variable capacitor cell 71a, the second variable capacitor cell 71b, and the third variable capacitor cell 71c have different capacitance weights or sizes. For example, the variable capacitor cells of a particular variable capacitor array can increase in size by a scaling factor, such as 2.

The IC 60 includes a first signal path from the first RF input $RF_{IN1}$ to the first RF output $RF_{OUT1}$ through the first variable capacitor array 61. Additionally, the IC 60 includes a second signal path from the second RF input $RF_{IN2}$ to the second RF output $RF_{OUT2}$ through the second variable capacitor array 62, and a third signal path from the third RF input $RF_{IN3}$ to the third RF output $RF_{OUT3}$ through the third variable capacitor array 63.

In certain embodiments, the IC 60 does not include any switches in the signal paths between the IC's inputs and outputs through the variable capacitor arrays. By configuring the variable capacitor arrays in this manner, the variable capacitor arrays can have lower insertion loss and/or higher linearity relative to a configuration in which capacitance is provided by selecting discrete capacitors via switches.

As shown in FIG. 4, multiple variable capacitor arrays can be fabricated on a common IC, and can share control signals but receive different RF signals. However, other configurations are possible, such as implementations in which the variable capacitor arrays receive separate control signals.

Figure 5A:
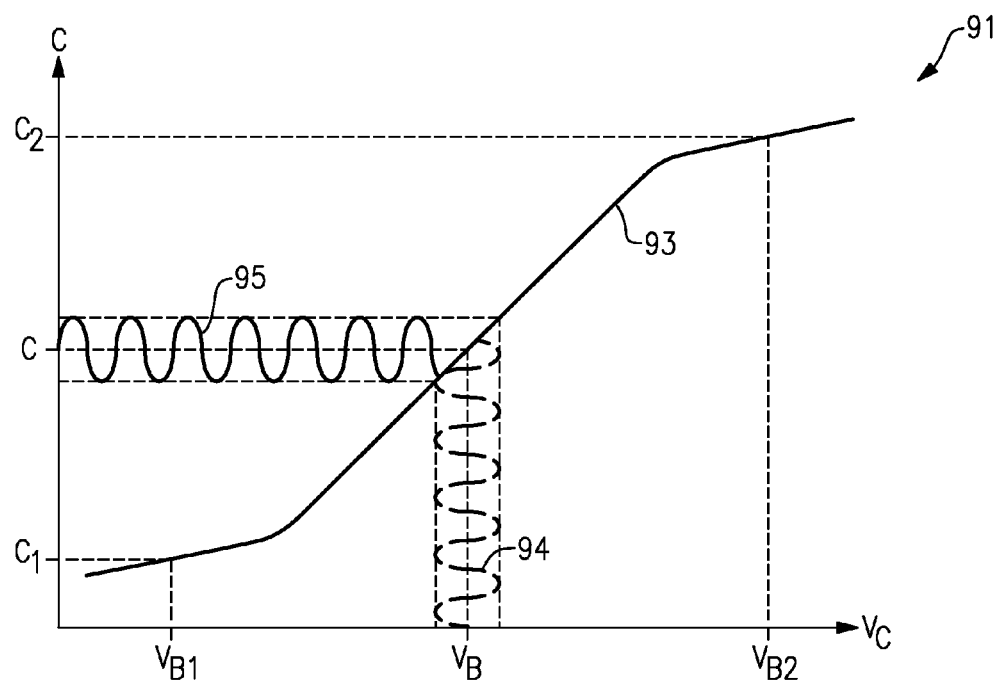
FIGS. 5A and 5B are graphs of two examples of capacitance versus bias voltage.
Figure 5B:
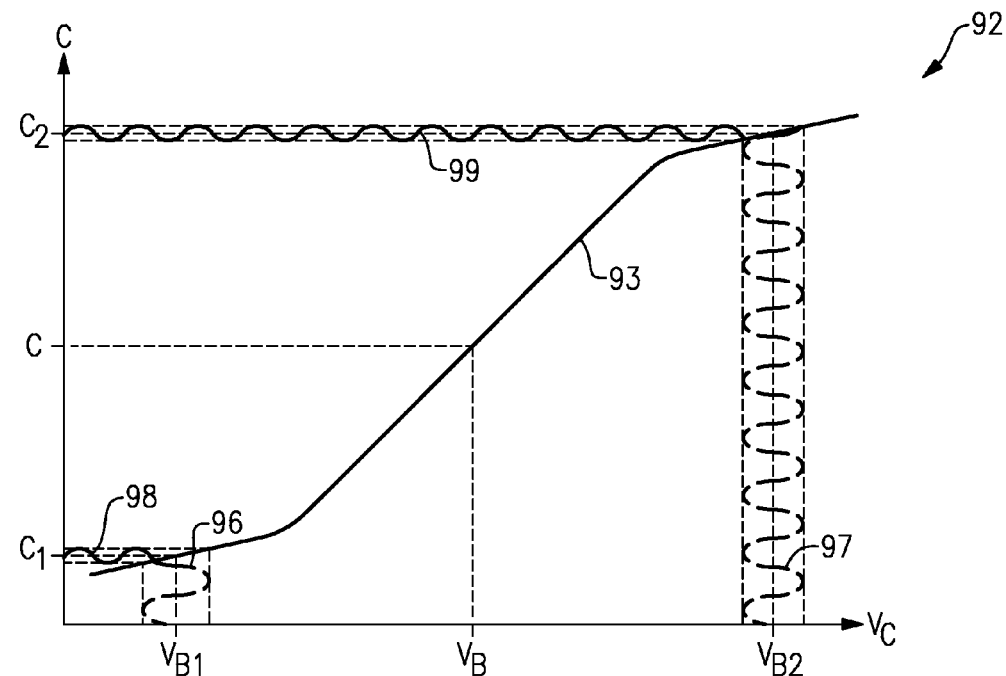

FIGS. 5A and 5B are graphs of two examples of capacitance versus bias voltage. FIG. 5A includes a first graph 91 of capacitance versus voltage, and FIG. 5B includes a second graph 92 of capacitance versus voltage.

The first graph 91 includes a high frequency capacitance-voltage (CV) plot 93 for one example of an n-type MOS capacitor. As shown in the CV plot 93, the capacitance of the MOS capacitor can increase with bias voltage level. The increase in capacitance can be associated with the MOS capacitor transitioning between operating regions or modes. For example, at low bias voltage levels, the MOS capacitor can operate in an accumulation mode in which a majority carrier concentration near the gate dielectric/semiconductor interface is greater than a background majority carrier concentration of the semiconductor. Additionally, as the voltage level of the bias voltage increases, the MOS capacitor can transition from the accumulation mode to a depletion mode in which minority and majority carrier concentrations near the gate dielectric/semiconductor interface are less than the background majority carrier concentration. Furthermore, as the voltage level of the bias voltage further increases, the MOS capacitor can transition from the depletion mode to an inversion mode in which the minority carrier concentration near the gate dielectric/semiconductor interface is greater than the background majority carrier concentration.

The first graph 91 has been annotated to include an AC signal component 94 when biasing the MOS capacitor at a bias voltage level $V_B$. When the AC signal component 94 is not present, the MOS capacitor can have a capacitance C. However, as shown by in FIG. 5A, the AC signal component 94 can generate a capacitance variation 95. The capacitance variation 95 can be associated with a capacitance variation generated by the AC signal component 94.

With reference to FIG. 5B, the second graph 92 includes the CV plot 93, which can be as described above. The second graph 92 has been annotated to include a first AC signal component 96 associated with biasing the MOS capacitor at a first bias voltage level $V_{B1}$, and a second AC signal component 97 associated with biasing the MOS capacitor at a second bias voltage level $V_{B2}$.

As shown in FIG. 5B, the first AC signal component 96 can generate a first capacitance variation 98, and the second AC signal component 97 can generate a second capacitance variation 99.

When biased at the first bias voltage level $V_{B1}$ or the second bias voltage level $V_{B2}$, the MOS capacitor can nevertheless have a capacitance that varies in the presence of AC signals. However, the first and second bias voltage levels $V_{B1}$, $V_{B2}$ can be associated with DC bias points of the MOS capacitor having relatively small capacitance variation or change.

Accordingly, in contrast to the capacitance variation 95 of FIG. 5A which has a relatively large magnitude, the first and second capacitance variations 98, 99 of FIG. 5B have a relatively small magnitude.

In certain embodiments herein, a variable capacitor array includes MOS capacitors that are biased at bias voltages associated with small capacitance variation. By biasing the MOS capacitors in this manner, a variable capacitor array can exhibit high linearity.

Such a variable capacitor array can also have less capacitance variation when operated in a system using multiple frequency bands. For example, when included in a programmable duplexer, such as the programmable duplexer 1 of FIG. 1, the variable capacitor array can provide relatively constant capacitance even when tuned to frequency bands that are separated by a wide frequency.

In certain embodiments, the first bias voltage level $V_{B1}$ is selected to operate in the MOS capacitor in an accumulation mode, and the second bias voltage level $V_{B2}$ is selected to operate the MOS capacitor in an inversion mode. In certain configurations, biasing a MOS capacitor in this manner can achieve a capacitance tuning range of 3:1 or more. However, other tuning ranges can be realized, including, for example, a tuning range associated with a particular manufacturing process used to fabricate the MOS capacitor.

Figure 6:
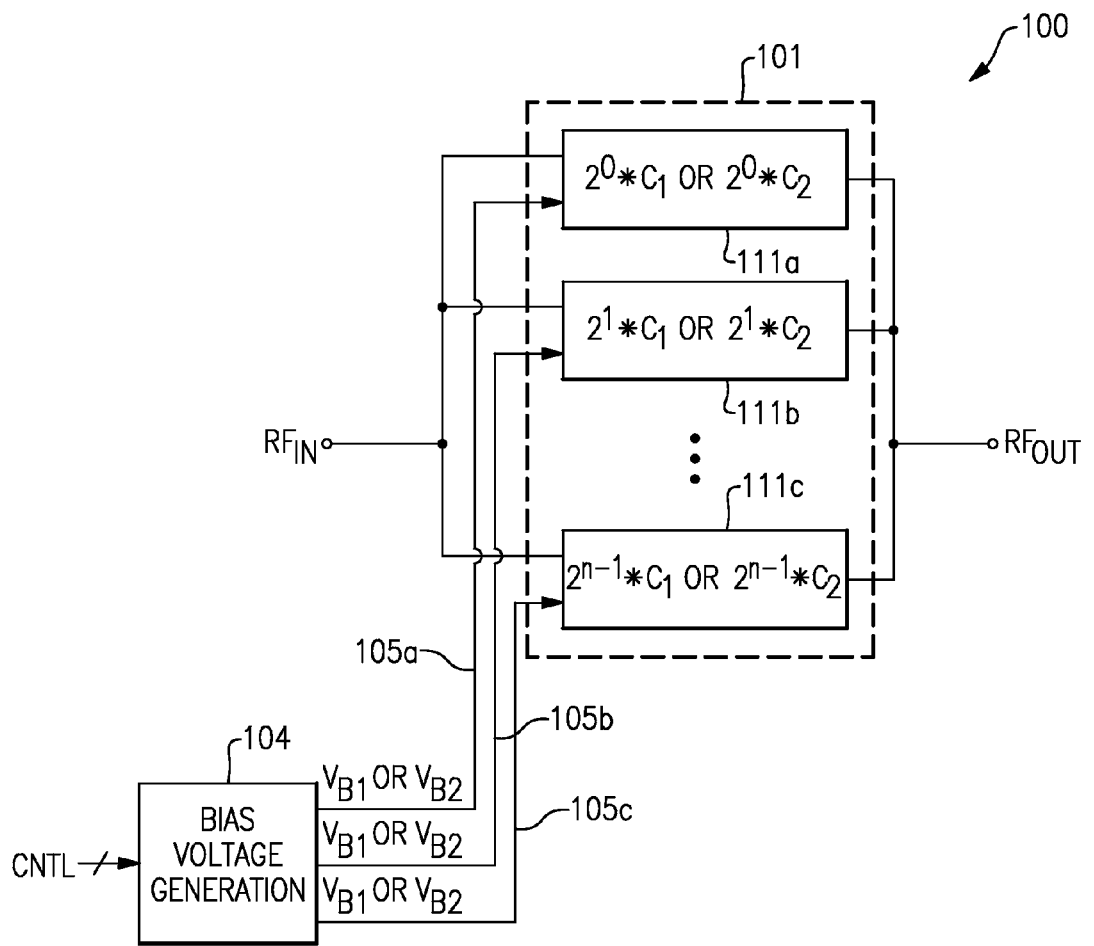
FIG. 6 is a schematic diagram of an IC according to another embodiment.

FIG. 6 is a schematic diagram of an IC 100 according to another embodiment. The IC 100 includes a variable capacitor array 101 and a bias voltage generation circuit 104. Although FIG. 6 illustrates a configuration in which the IC 100 includes one variable capacitor array, the IC 100 can be adapted to include additional variable capacitor arrays and/or other circuitry.

The variable capacitor array 101 includes a first MOS variable capacitor cell 111a, a second MOS variable capacitor cell 111b, and a third MOS variable capacitor cell 111c, which have been electrically connected in parallel between an RF input $RF_{IN}$ and an RF output $RF_{OUT}$. Although the illustrated variable capacitor array 101 includes three MOS variable capacitor cells, the variable capacitor array 101 can be adapted to include more or fewer MOS variable capacitor cells.

The bias voltage generation circuit 104 receives the control signal CNTL, and generates a first bias voltage 105a for the first MOS variable capacitor cell 111a, a second bias voltage 105b for the second MOS variable capacitor cell 111b, and a third bias voltage 105c for the third MOS variable capacitor cell 111c.

In the illustrated configuration, the control signal CNTL can be used to set the voltage level of the first bias voltage 105a to a first bias voltage level $V_{B1}$ or to a second bias voltage level $V_{B2}$. Similarly, the control signal CNTL can be used to set the voltage level of the second bias voltage 105b to the first bias voltage level $V_{B1}$ or to the second bias voltage level $V_{B2}$, and to set the voltage level of the third bias voltage 105c to the first bias voltage level $V_{B1}$ or to the second bias voltage level $V_{B2}$.

By controlling the voltage levels of the bias voltages to the first or second bias voltage levels $V_{B1}$, $V_{B2}$, the variable capacitor array 101 can exhibit a small variation in capacitance in the presence of an RF signal at the RF input $RF_{IN}$. Accordingly, the variable capacitor array 101 can exhibit high linearity in the presence of RF signals.

The control signal CNTL can control an overall capacitance of the variable capacitor array 101. For example, the size of the first, second, and third MOS capacitors cells 111a-111c can be weighted relative to one another, and an overall capacitance of the variable capacitor array 101 can be based on a sum of the capacitances of the array's MOS variable capacitor cells.

In one embodiment, the variable capacitor array's MOS variable capacitor cells are scaled by a factor of 2. For example, a second MOS variable capacitor cell of the variable capacitor array can have a size that is about a factor of 2 relative to a first MOS variable capacitor cell of the variable capacitor array. Additionally, an nth MOS variable capacitor cell in the array can have a size that is about $2^{n-1}$ that of the first MOS variable capacitor cell, where n is an integer greater than or equal to 2. Although one possible variable capacitor array sizing scheme has been described, other configurations are possible.

When a variable capacitor array includes n MOS variable capacitor cells that are scaled by a factor of 2 relative to one another, the bias voltage generation circuit 104 can control the array's first MOS variable capacitor cell to a capacitance of $C_1$ or $C_2$ by biasing the first MOS variable capacitor cell with the first bias voltage level $V_{B1}$ or the second bias voltage level $V_{B2}$. Additionally, the bias voltage generation circuit 104 can control the array's second MOS variable capacitor cell to a capacitance of $2^1*C_1$ or $2^1*C_2$ by biasing the second MOS variable capacitor cell with the first bias voltage level $V_{B1}$ or the second bias voltage level $V_{B2}$. Furthermore, the bias voltage generation circuit 104 can control the array's nth MOS variable capacitor cell to a capacitance of $2^{n-1}*C_1$ or $2^{n-1}*C_2$ by biasing the nth MOS variable capacitor cell with the first bias voltage level $V_{B1}$ or the second bias voltage level $V_{B2}$.

Configuring the bias voltage generation circuit 104 to control a bias voltage to one of two voltage levels can simplify a coding scheme associated with the control signal CNTL. For example, in such a configuration, the control signal CNTL can comprise a digital control signal, and individual bits of the digital control signal can be used to control the array's bias voltages to a particular bias voltage level. Although one possible coding scheme of the control signal CNTL has been described, other configurations are possible.

FIGS. 7A-7D show schematic diagrams of variable capacitor cells according to various embodiments. The variable capacitor cells of FIGS. 7A-7D can be used in any of the variable capacitor arrays described herein.

Figure 7A:
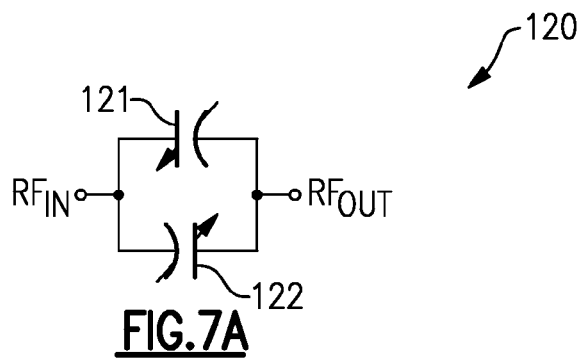
FIGS. 7A-7D show schematic diagrams of variable capacitor cells according to various embodiments.

FIG. 7A is a schematic diagram of a variable capacitor cell 120 according to one embodiment. The variable capacitor cell 120 includes a first variable capacitor 121 and a second variable capacitor 122. The variable capacitor cell 120 further includes an RF input $RF_{IN}$ and an RF output $RF_{OUT}$.

The first variable capacitor 121 includes an anode electrically connected to the RF input $RF_{IN}$ and a cathode electrically connected to the RF output $RF_{OUT}$. The second variable capacitor 122 includes an anode electrically connected to the RF output $RF_{OUT}$ and a cathode electrically connected to the RF input $RF_{IN}$.

In the illustrated configuration, an anode structure of the first and second variable capacitors 121, 122 is different than a cathode structure of the first and second variable capacitors 121, 122. For example, the first and second variable capacitors 121, 122 can be implemented by first and second MOS capacitors, respectively. Additionally, the first and second MOS capacitors can have anodes associated with transistor gates and cathodes associated with transistor source and/or drain regions.

The first and second variable capacitors 121, 122 have been implemented in an anti-parallel or inverse parallel configuration. Electrically connecting the first and second variable capacitors 121, 122 in this manner can enhance the robustness of the capacitors to capacitance variation in the presence of RF signals. For example, when the first and second variable capacitors are each biased with a particular bias voltage, the variable capacitors' capacitance may change when an RF input signal is received on the RF input $RF_{IN}$. However, a capacitance variation AC of the first and second variable capacitors 121, 122 can have about equal magnitude, but opposite polarity. For instance, in the presence of an RF input signal that generates a capacitance variation having a magnitude ΔC, the first variable capacitor 121 may have a capacitance $C_V+\Delta C$, while the second variable capacitor 122 may have a capacitance $C_V-\Delta C$. Since the first and second variable capacitors 121, 122 are electrically connected in parallel with one another, an overall capacitance of the first and second variable capacitors 121, 122 can be about equal to $2*C_V$.

Accordingly, the illustrated configuration can provide reduced capacitance variation in the presence of RF signals. Furthermore, the illustrated variable capacitor cell 120 can exhibit high linearity.

Figure 7B:
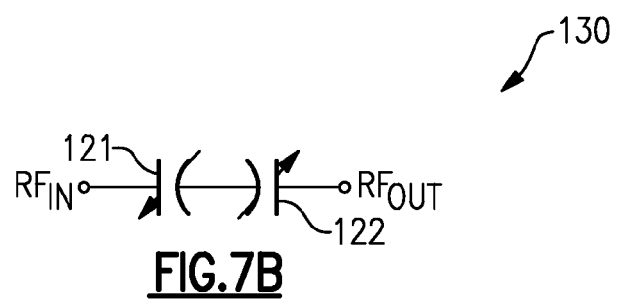

FIG. 7B is a schematic diagram of a variable capacitor cell 130 according to one embodiment. The variable capacitor cell 130 includes the first and second variable capacitors 121, 122.

The variable capacitor cell 130 of FIG. 7B is similar to the variable capacitor cell 120 of FIG. 7A, except that the variable capacitor cell 130 includes a different arrangement of the first and second variable capacitors 121, 122. In particular, in contrast to the variable capacitor cell 120 of FIG. 7A which implements the first and second variable capacitors 121, 122 in an anti-parallel configuration, the variable capacitor cell 130 of FIG. 7B implements the first and second variable capacitors 121, 122 in an anti-series or inverse series configuration.

For example, the first variable capacitor 121 includes an anode electrically connected to the RF input $RF_{IN}$, and a cathode electrically connected to a cathode of the second variable capacitor 122. Additionally, the second variable capacitor 122 further includes an anode electrically connected to the RF output $RF_{OUT}$.

Configuring the variable capacitor cell 130 in this manner can reduce variation of the cell's capacitance in the presence of an RF input signal at the RF input $RF_{IN}$.

Although the variable capacitor cell 130 of FIG. 7B can have a smaller capacitance relative to the variable capacitor cell 120 of FIG. 7A for a given bias voltage level, the variable capacitor cell 130 of FIG. 7B can have a higher voltage handling capability relative to the variable capacitor cell 120 of FIG. 7A.

Figure 7C:
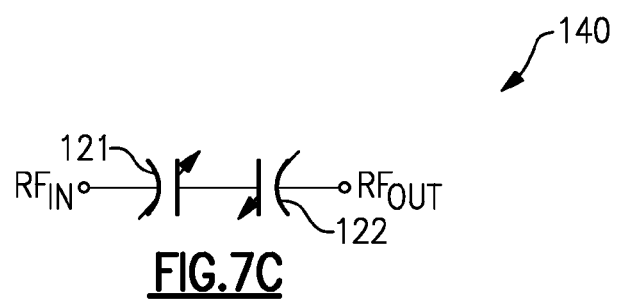

FIG. 7C is a schematic diagram of a variable capacitor cell 140 according to another embodiment. The variable capacitor cell 140 includes the first and second variable capacitors 121, 122.

The variable capacitor cell 140 of FIG. 7C is similar to the variable capacitor cell 130 of FIG. 7B, except that the variable capacitor cell 140 illustrates a different anti-series configuration of the first and second variable capacitors 121, 122. In particular, in contrast to the variable capacitor cell 130 of FIG. 7B in which the cathodes of the first and second variable capacitors 121, 122 are electrically connected to one another, the variable capacitor cell 140 of FIG. 7C illustrates a configuration in which the anodes of the first and second variable capacitors 121, 122 are electrically connected to one another.

In certain configurations, the variable capacitor cell 140 of FIG. 7C can be more robust against damage from electrostatic discharge (ESD) events relative to the variable capacitor cell 130 of FIG. 7B.

For example, the RF input $RF_{IN}$ and RF output $RF_{OUT}$ of the variable capacitor cell 140 may be electrically connected to input and output pins of an IC on which the variable capacitor cell 140 is fabricated. Additionally, the first and second variable capacitors 121, 122 can be implemented using MOS capacitors, which can include a gate that operates as an anode and a source and drain that are electrically connected to one another and operate as a cathode. Since a MOS capacitor's source and drain regions typically can withstand a greater voltage relative to the MOS capacitor's gate region, the variable capacitor cell 140 of FIG. 7C may exhibit a greater robustness to ESD events or other overvoltage conditions relative to the variable capacitor cell 130 of FIG. 7B.

Figure 7D:
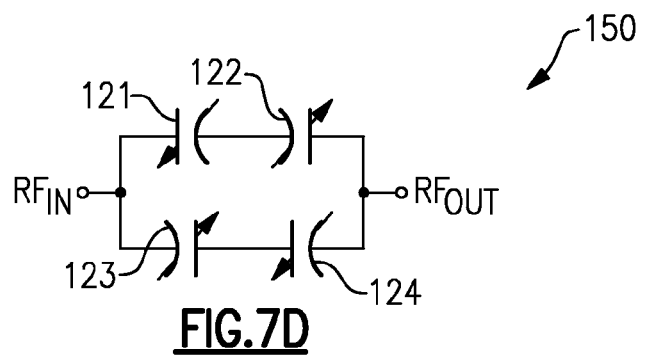

FIG. 7D is a schematic diagram of a variable capacitor cell 150 according to another embodiment. The variable capacitor cell 150 includes the first and second variable capacitors 121, 122, which have been arranged in the anti-series configuration shown in FIG. 7B. The variable capacitor cell 150 further includes a third variable capacitor 123 and a fourth variable capacitor 124, which have been arranged in the anti-series configuration shown in FIG. 7C.

As shown in FIG. 7D, certain variable capacitor cells can include a combination of variable capacitors arranged in anti-series and/or anti-parallel configurations. The variable capacitor cell 150 illustrates one example of such a combination. However, other configurations are possible.

FIGS. 8A-8D show schematic diagrams of MOS variable capacitor cells according to various embodiments. The MOS variable capacitor cells of FIGS. 8A-8D can be used in any of the variable capacitor arrays described herein.

Figure 8A:
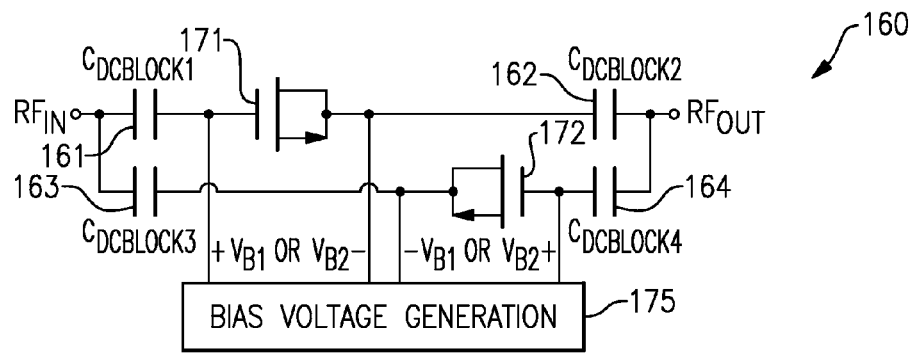
FIGS. 8A-8D show schematic diagrams of metal oxide semiconductor (MOS) variable capacitor cells according to various embodiments.

FIG. 8A is a schematic diagram of a MOS variable capacitor cell 160 according to one embodiment. The MOS variable capacitor cell 160 includes a first DC blocking capacitor 161, a second DC blocking capacitor 162, a third DC blocking capacitor 163, a fourth DC blocking capacitor 164, a first MOS capacitor 171, and a second MOS capacitor 172. The MOS variable capacitor cell 160 further includes an RF input $RF_{IN}$ and an RF output $RF_{OUT}$.

Electrical connections between the MOS variable capacitor cell 160 and a bias voltage generation circuit 175 have been illustrated in FIG. 8A. Although not illustrated in FIG. 8A, the bias voltage generation circuit 175 can be used to bias additional MOS variable capacitor cells.

The first DC blocking capacitor 161 ($C_{DCBLOCK1}$) is electrically connected between the RF input $RF_{IN}$ and a gate of the first MOS capacitor 171. Additionally, the second DC blocking capacitor 162 ($C_{DCBLOCK2}$) is electrically connected between the RF output $RF_{OUT}$ and a source and drain of the first MOS capacitor 171. Furthermore, the third DC blocking capacitor 163 ($C_{DCBLOCK3}$) is electrically connected between the RF input $RF_{IN}$ and a source and drain of the second MOS capacitor 172. Additionally, the fourth DC blocking capacitor 164 ($C_{DCBLOCK4}$) is electrically connected between the RF output $RF_{OUT}$ and a gate of the second MOS capacitor 172.

As shown in FIG. 8A, the bias voltage generation circuit 175 can be used to bias the first and second MOS capacitors 171, 172 at a first bias voltage level $V_{B1}$ or at a second bias voltage level $V_{B2}$. In one embodiment, the first and second MOS capacitors 171, 172 operate in accumulation when biased at the first bias voltage level $V_{B1}$ and operate in inversion when biased at the second bias voltage level $V_{B2}$.

Biasing the first and second MOS capacitors 171, 172 in this manner can improve linearity relative to a configuration in which the first and second MOS capacitors 171, 172 are biased at a bias voltage level selected from a continuous tuning voltage range. For example, a MOS capacitor can exhibit a change in capacitance in response to changes in an applied RF signal, and a magnitude of the capacitance change can vary with the MOS capacitor's bias voltage level.

Figure 8B:
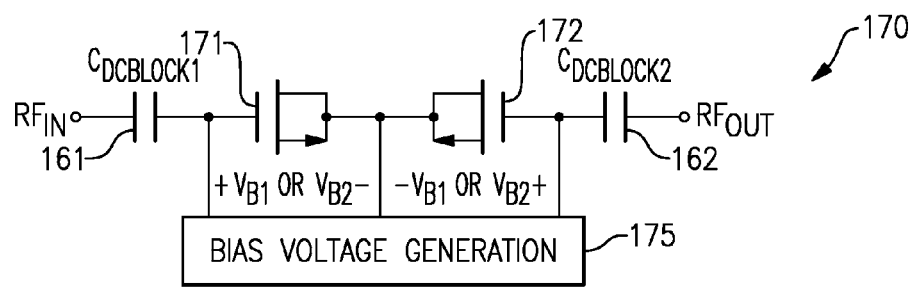

FIG. 8B is a schematic diagram of a MOS variable capacitor cell 170 according to another embodiment. The MOS variable capacitor cell 170 includes the first and second DC blocking capacitors 161, 162 and the first and second MOS capacitors 171, 172. Electrical connections between the MOS variable capacitor cell 170 and the bias voltage generation circuit 175 have been illustrated in FIG. 8B.

The MOS variable capacitor cell 170 of FIG. 8B is similar to the MOS variable capacitor cell 160 of FIG. 8A, except that the MOS variable capacitor cell 170 of FIG. 8B implements the first and second MOS capacitors 171, 172 in an anti-series configuration, rather than in an anti-parallel configuration.

For example, in the illustrated configuration, the first DC blocking capacitor 161 ($C_{DCBLOCK1}$) is electrically connected between the RF input $RF_{IN}$ and the gate of the first MOS capacitor 171. Additionally, the source and drain of the first MOS capacitor 171 are electrically connected to the source and drain of the second MOS capacitor 172. Furthermore, the second DC blocking capacitor 162 ($C_{DCBLOCK2}$) is electrically connected between the RF output $RF_{OUT}$ and the gate of the second MOS capacitor 172. As shown in FIG. 8B, the bias voltage generation circuit 175 can be used to bias the first and second MOS capacitors 171, 172 at the first bias voltage level $V_{B1}$ or at the second bias voltage level $V_{B2}$.

Figure 8C:
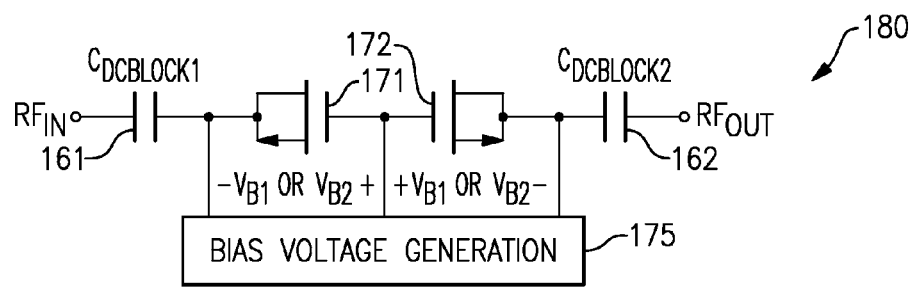

FIG. 8C is a schematic diagram of a MOS variable capacitor cell 180 according to another embodiment. The MOS variable capacitor cell 180 includes the first and second DC blocking capacitors 161, 162 and the first and second MOS capacitors 171, 172. Electrical connections between the MOS variable capacitor cell 180 and the bias voltage generation circuit 175 have been illustrated in FIG. 8C.

The MOS variable capacitor cell 180 of FIG. 8C is similar to the MOS variable capacitor cell 170 of FIG. 8B, except that the MOS variable capacitor cell 180 illustrates a different anti-series configuration of the first and second MOS capacitors 171, 172 relative to the anti-series configuration shown in FIG. 8B. In particular, in contrast to the MOS variable capacitor cell 170 of FIG. 8B in which the sources/drains of the first and second MOS capacitors 181, 182 are electrically connected to one another, the MOS variable capacitor cell 180 of FIG. 8C illustrates a configuration in which the gates of the first and second MOS capacitors 171, 172 are electrically connected to one another.

For example, in the illustrated configuration, the first DC blocking capacitor 161 ($C_{DCBLOCK1}$) is electrically connected between the RF input $RF_{IN}$ and the source and drain of the first MOS capacitor 171. Additionally, the gate of the first MOS capacitor 171 is electrically connected to the gate of the second MOS capacitor 172. Furthermore, the second DC blocking capacitor 162 ($C_{DCBLOCK2}$) is electrically connected between the RF output $RF_{OUT}$ and the source and drain of the second MOS capacitor 172. As shown in FIG. 8C, the bias voltage generation circuit 175 can be used to bias the first and second MOS capacitors 171, 172 at the first bias voltage level $V_{B1}$ or at the second bias voltage level $V_{B2}$.

In certain configurations, the MOS variable capacitor cell 180 of FIG. 8C can be more robust against damage from ESD events relative to the MOS variable capacitor cell 170 of FIG. 8B. For example, the RF input $RF_{IN}$ and the RF output $RF_{OUT}$ may be electrically connected to input and output pins of an IC, and the MOS capacitors' source and drain regions may be capable of withstanding higher voltages relative to the MOS capacitors' gate regions.

Figure 8D:
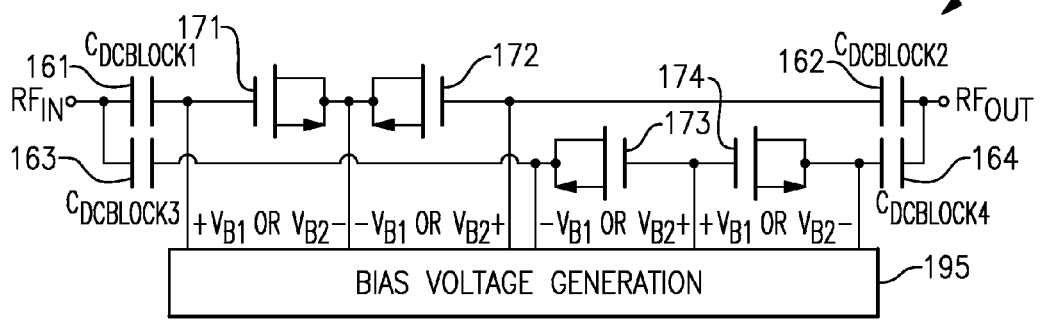

FIG. 8D is a schematic diagram of a MOS variable capacitor cell 190 according to another embodiment. The MOS variable capacitor cell 190 includes the first and second DC blocking capacitors 161, 162 and the first and second MOS capacitors 171, 172, which have been arranged in the anti-series configuration shown in FIG. 8B. The MOS variable capacitor cell 190 further includes a third DC blocking capacitor 163 ($C_{DCBLOCK3}$), a fourth DC blocking capacitor 164 ($C_{DCBLOCK4}$), a third MOS capacitor 173, and a fourth MOS capacitor 174, which have been arranged in the anti-series configuration shown in FIG. 8C. Electrical connections between the MOS variable capacitor cell 190 and a bias voltage generation circuit 195 have been illustrated in FIG. 8D.

As shown in FIG. 8D, certain MOS variable capacitor cells can include a combination of MOS capacitors arranged in anti-series and/or anti-parallel configurations. The MOS variable capacitor cell 190 illustrates one example of such a combination. However, other configurations are possible.

Figure 9A:
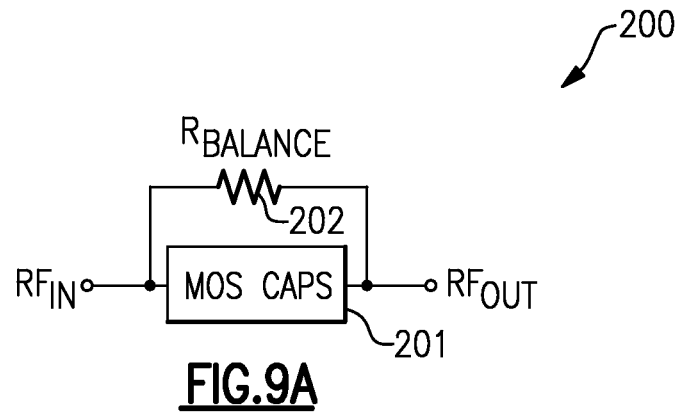
FIG. 9A is a schematic diagram of a MOS variable capacitor cell according to another embodiment.

FIG. 9A is a schematic diagram of a MOS variable capacitor cell 200 according to another embodiment. The MOS variable capacitor cell 200 includes a pair of MOS capacitors 201 and a balancing resistor 202 ($R_{BALANCE}$). Although not illustrated in FIG. 9A for clarity, the pair of MOS capacitors 201 can receive one or more bias voltages for controlling capacitance.

As shown in FIG. 9A, pair of MOS capacitors 201 includes an input electrically connected to an RF input $RF_{IN}$ and an output electrically connected to an RF output $RF_{OUT}$. Additionally, the balancing resistor 202 includes a first end electrically connected to the RF input $RF_{IN}$ and a second end electrically connected to the RF output $RF_{OUT}$. In certain configurations, the pair of MOS capacitors 201 can include a first MOS capacitor and a second MOS capacitor implemented in an anti-parallel configuration or in an anti-series configuration.

Including the balancing resistor 202 can aid in improving the linearity of the MOS variable capacitor cell 200. For example, the balancing resistor 202 can enhance third-order intermodulation distortion (IMD3) relative to a configuration in which the balancing resistor 202 is omitted. However, the balancing resistor 202 may also degrade Q-factor. Accordingly, the balancing resistor 202 can be included or excluded and/or have a resistance selected to achieve a desired balance between linearity and Q-factor.

Additional details of the MOS variable capacitor cell 200 can be similar to those described earlier.

Figure 9B:
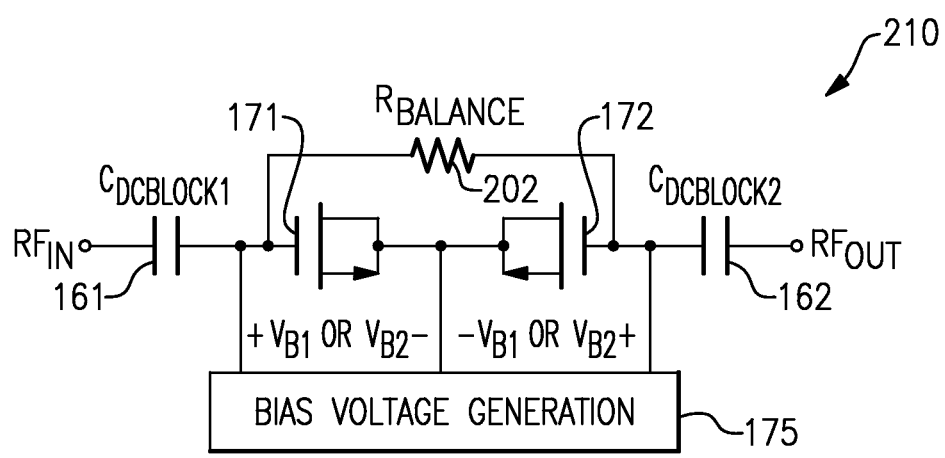
FIG. 9B is a schematic diagram of a MOS variable capacitor cell according to another embodiment.

FIG. 9B is a schematic diagram of a MOS variable capacitor cell 210 according to another embodiment. The MOS variable capacitor cell 210 includes the first and second DC blocking capacitors 161, 162, the first and second MOS capacitors 171, 172, and the balancing resistor 202. Electrical connections between the MOS variable capacitor cell 210 and the bias voltage generation circuit 175 have been illustrated in FIG. 9B.

The MOS variable capacitor cell 210 of FIG. 9B is similar to the MOS variable capacitor cell 170 of FIG. 8B, except that the MOS variable capacitor cell 210 of FIG. 9B further includes the balancing resistor 202. As shown in FIG. 9B, the balancing resistor 202 includes a first end electrically connected to a gate of the first MOS capacitor 171 and a second end electrically connected to a gate of the second MOS capacitor 172.

The balancing resistor 202 can aid in improving the linearity of the MOS variable capacitor cell 210 relative to the MOS variable capacitor cell 170 of FIG. 8B. However, including the balancing resistor 202 can also degrade the cell's Q-factor.

Although FIG. 9B illustrates the balancing resistor 202 in the context of MOS capacitors arranged in an anti-series configuration, one or more balancing resistors can be used in a MOS variable capacitor cell that includes MOS capacitors arranged in other ways. For example, one or more balancing resistors can be included in any of the MOS variable capacitor cells shown in FIGS. 8A-8D.

Additional details of the MOS variable capacitor cell 210 can be similar to those described earlier.

Figure 10:
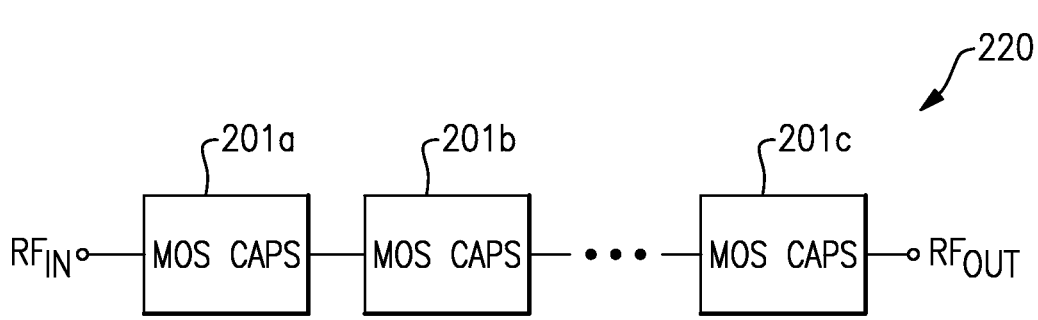
FIG. 10 is a schematic diagram of a MOS variable capacitor cell according to another embodiment.

FIG. 10 is a schematic diagram of a MOS variable capacitor cell 220 according to another embodiment. The MOS variable capacitor cell 220 includes a first pair of MOS capacitors 201a, a second pair of MOS capacitors 201b, and a third pair of MOS capacitors 201c.

Although the MOS variable capacitor cell 220 is illustrated as including three pairs of MOS capacitors, the teachings herein are applicable to configurations including more or fewer MOS capacitors. Additionally, although not illustrated in FIG. 10 for clarity, the pairs of MOS capacitors 201a-201c can receive one or more bias voltages for controlling capacitance.

In the illustrated configuration, the first pair of MOS capacitors 201a, the second pair of MOS capacitors 201b, and the third pair of MOS capacitors 201c have been arranged in between an RF input $RF_{IN}$ and an RF output $RF_{OUT}$. Arranging one or more pairs of MOS capacitors in a cascade can increase a voltage handling capability of the MOS variable capacitor cell.

In certain implementations, the first pair of MOS capacitors 201a, the second pair of MOS capacitors 201b, and the third pair of MOS capacitors 201c includes pairs of MOS capacitors arranged in an anti-parallel configuration, an anti-series configuration, or a combination thereof.

Additional details of the MOS variable capacitor cell 220 can be similar to those described earlier.

FIG. 11A is a schematic diagram of an IC 250 according to another embodiment. The IC 250 includes the variable capacitor array 101 and the bias voltage generation circuit 104, which can be as described earlier with respect to FIG. 6. The IC 250 further includes a capacitance correction circuit 251. Although the illustrated IC 250 includes one variable capacitor array, the IC 250 can be adapted to include additional variable capacitor arrays and/or other circuitry.

The capacitance correction circuit 251 receives a control signal CTNL and a band signal BAND, and generates an adjusted control signal 253. The bias voltage generation circuit 104 can use the adjusted control signal 253 to control the capacitance of the variable capacitor array 101.

The capacitance correction circuit 251 can generate the adjusted control signal 253 by correcting the control signal CNTL based on a frequency band indicated by the band signal BAND. The capacitance correction circuit 251 includes a band adjustment circuit 252, which can use the band signal BAND to determine a correction or adjustment of the capacitance correction circuit 251. In one embodiment, the capacitance correction circuit 251 comprises a programmable memory that can be programmed to include band adjustment data. For example, the band adjustment data can represent a table of frequency bands and associated adjustments.

In certain configurations, the variable capacitor array 101 can be included in a programmable duplexer, a programmable RF filter, and/or other RF circuitry that operates across multiple frequency bands. For example, the variable capacitor array 101 can be included in an application in which the RF input $RF_{IN}$ can receive an RF signal associated with one of multiple frequency bands, including, but not limited to, Universal Mobile Telecommunications System (UMTS) Band II, Band IV, Band V, Band XII, or Band XIII. Although specific examples of frequency bands have been described above, the teachings herein are applicable to a wide range of frequency bands.

Including the capacitance correction circuit 251 can aid in improving the performance of the variable capacitor array 101 in multi-band configurations. For example, high frequency effects can result in a variation of the variable capacitor array's capacitance in the presence of an RF input signals of different frequencies. Additionally, the capacitance correction circuit's band adjustment circuit 252 can be used to compensate for such effects, by providing an adjustment to the control signal CNTL, which can change from band to band.

Additional details of the IC 250 can be as described earlier.

FIG. 11B is a schematic diagram of an IC 260 according to another embodiment. The IC 260 includes the variable capacitor array 101 and the bias voltage generation circuit 104, which can be as described earlier with respect to FIG. 6. The IC 260 further includes a capacitance correction circuit 261 and a capacitance detection circuit 262. Although the illustrated IC 260 includes one variable capacitor array, the IC 260 can be adapted to include additional variable capacitor arrays and/or other circuitry.

The illustrated capacitance correction circuit 261 receives the control signal CNTL, a calibration signal CAL, an error signal ERROR, and generates an adjusted control signal 263. The bias voltage generation circuit 104 can use the adjusted control signal 263 to control the capacitance of the variable capacitor array 101.

The calibration signal CAL can be used to initialize an array calibration, in which the capacitance correction circuit 261 sets the adjusted control signal 263 to a particular value and the capacitance detection circuit 262 detects a capacitance of the variable capacitor array 101. Additionally, the capacitance detection circuit 262 can generate the error signal ERROR based on a difference between an expected capacitance of the array relative to a detected or observed capacitance of the array.

The capacitance detection circuit 262 can detect the capacitance of the variable capacitor array 101 in a variety of ways. For example, in one embodiment, the capacitance detection circuit 262 can observe a current from the array in response to an applied voltage with a controlled rate of change. Additionally, the observed current can be compared to a reference current to generate the error signal ERROR. In another embodiment, the capacitance detection circuit 262 can observe a voltage across the array in response to an applied current. Although two examples of capacitance detection circuits have been described, other configurations are possible.

The error signal ERROR is provided to the capacitance correction circuit 261, and can be used during normal operation of the IC 260 to adjust the control signal CNTL. Configuring the IC 260 in this manner can aid in compensating for capacitance variation of the variable capacitor array 101 associated with, for example, manufacturing variation.

Although FIG. 11B illustrates a configuration in which the capacitance correction circuit 261 directly detects a capacitance of the variable capacitor array 101, the capacitance correction circuit 261 can also be configured to indirectly detect the capacitance of the variable capacitor array 101. For example, the capacitance correction circuit 261 can be configured to detect a capacitance of a replica of the variable capacitor array 101 or a portion thereof. The capacitance of the replica may track a capacitance variation of the variable capacitor array 101 associated with processing. In such a configuration, the replica may be biased in a variety of ways, including, for example, with one or more bias voltages having bias voltage levels selected for calibration. Detecting the capacitance of a replica can avoid loading the RF input $RF_{IN}$ and/or RF output $RF_{OUT}$ with the capacitance correction circuit 261. However, such a configuration may also have increased area and/or power consumption.

Although FIG. 11A and FIG. 11B illustrate two examples of capacitance correction schemes, the teachings herein can be used with other configurations of capacitance correction.

Additionally, in one embodiment, a capacitance correction circuit is adapted to provide both capacitance correction based on band adjustment and capacitance correction based on a capacitance detected by a capacitance detection circuit.

Additional details of the IC 260 can be as described earlier.

Figure 12:
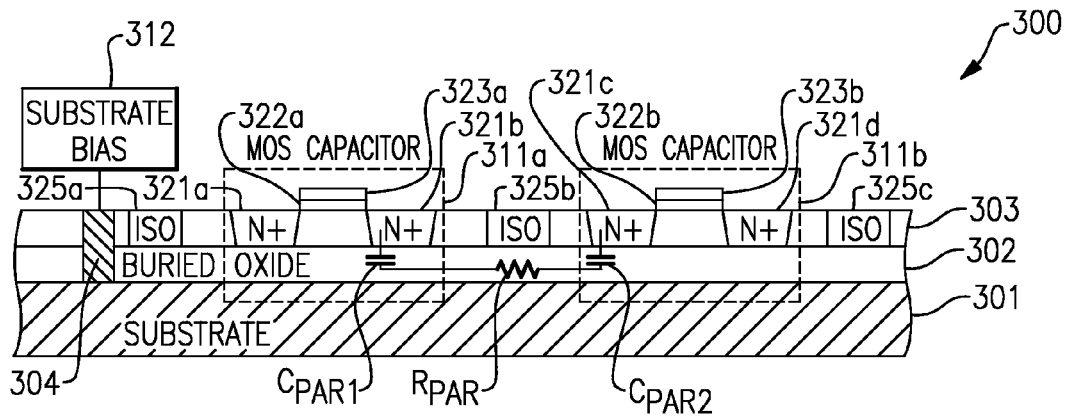
FIG. 12 is a schematic diagram of a cross section of an IC according to one embodiment.

FIG. 12 is a schematic diagram of a cross section of an IC 300 according to one embodiment. The IC 300 includes a support substrate 301, a buried oxide (BOX) layer 302 over the support substrate 301, and a device layer 303 over the BOX layer 302. The IC 300 further includes a substrate contact 304, which has been provided through the BOX layer 302 and the device layer 303 to provide electrical contact to the support substrate 301.

The illustrated IC 300 further includes a first MOS capacitor 311a and a second MOS capacitor 311b. The first MOS capacitor 311a includes source and drain regions 321a, 321b, respectively, which collectively operate as the first MOS capacitor's cathode. The first MOS capacitor 311a further includes a first gate region 323a, which is disposed over a first gate oxide region 322a and which operates as the first MOS capacitor's anode. The second MOS capacitor 311b includes source and drain regions 321c, 321d, respectively, which collectively operate as the second MOS capacitor's cathode. The second MOS capacitor 311b further includes a second gate region 323b, which is disposed over a second gate oxide region 322b and which operates as the second MOS capacitor's anode.

In the illustrated configuration, isolation regions have been used to help isolate the first and second MOS capacitors 311a, 311b from one another and from other structures of the IC 300. For example, the first MOS capacitor 311a is positioned between the first and second isolation regions 325a, 325b, and the second MOS capacitor 311b is positioned between the second and third isolation regions 325b, 325c. In certain configurations, isolation regions can be used to surround a perimeter of the first and second MOS capacitors 311a, 311b when viewed from above. In one embodiment, the first and second MOS capacitors 311a, 311b are associated with two different variable capacitor arrays.

Despite inclusion of the isolation regions 325a-325c, parasitic circuit components can result in parasitic coupling between the first and second MOS capacitors 311a, 311b. For example, a first parasitic capacitor $C_{PAR1}$ can be present between the cathode of the first MOS capacitor 311a and the BOX layer 302 and/or the support substrate 301, and a second parasitic capacitor $C_{PAR2}$ can be present between the cathode of the second MOS capacitor 311b and the BOX layer 302 and/or the support substrate 301. Additionally, the first and second parasitic capacitors $C_{PAR1}$, $C_{PAR2}$ can be electrically connected to one another via a parasitic resistor $R_{PAR}$, which can be associated with a resistance of the BOX layer 302 and/or the support substrate 301.

Although a capacitance of the first and second parasitic capacitors $C_{PAR1}$, $C_{PAR2}$ can be relatively small and a resistance of the parasitic resistor $R_{PAR}$ can be relatively large, parasitic coupling can nevertheless be present between the first and second MOS capacitors 311a, 311b. The parasitic coupling can lead to a degradation of the Q-factor of variable capacitor array that includes the first and second MOS capacitors 311a, 311b.

The IC 300 has been annotated to include the substrate bias circuit 312, which can be used to control a voltage level of the support substrate 301. For clarity of the figures, the substrate bias circuit 312 has been illustrated schematically as a box. However, the substrate bias circuit 312 can be fabricated on the IC 300.

In certain configurations, the substrate bias circuit 312 can be used to control the voltage level of the support substrate 301 so as to increase a resistivity of the parasitic resistor $R_{PAR}$ relative to a configuration in which the support substrate 301 is unbiased or electrically floating. For example, positive fixed charge in the BOX layer 302 can attract electrons to an interface between the BOX layer 302 and the support substrate 301, which can lead to an inversion or accumulation layer at the interface. The inversion layer can have a resistance that is much smaller than a resistance of the BOX layer 302, and thus can serve to increase parasitic coupling between the first and second MOS capacitors 311a, 311b, which can degrade Q-factor.

By biasing the support substrate 301 using the substrate bias circuit 312, the inversion layer at the interface between the support substrate 301 and the BOX layer 302 can become depleted. Accordingly, a parasitic interaction between the first and second MOS capacitors 311a, 311b can decrease, and a Q-factor of a variable capacitor array including the first and second MOS capacitors 311a, 311b can increase.

In one embodiment, the substrate bias circuit 312 is used to control the voltage level of the support substrate 301 to a voltage level in the range of about 10 V to about 40 V. However, other voltage levels are possible, including, for example, voltage levels associated with a particular fabrication process.

Although FIG. 12 illustrates an IC fabricated using an SOI process, the teachings herein are applicable to ICs fabricated using any of a wide range of processing technologies, including, for example, CMOS processes.

Figure 13A:
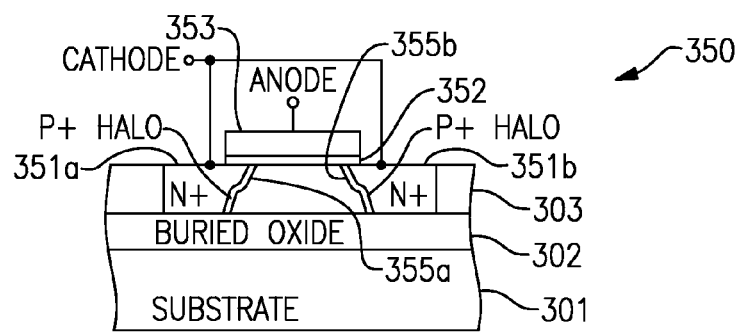
FIG. 13A is a cross section of a MOS capacitor according to one embodiment.

FIG. 13A is a cross section of a MOS capacitor 350 according to one embodiment. The MOS capacitor 350 includes source and drain regions 351a, 351b, respectively, which collectively operate as the MOS capacitor's cathode. The MOS capacitor 350 further includes a gate region 353, which operates as the MOS capacitor's anode.

As shown in FIG. 13A, the source and drain regions 351a, 351b are disposed in the device layer 303. Additionally, the device layer 303 is disposed over the BOX layer 302, which in turn is disposed over the support substrate 301. Additionally, the gate oxide region 352 is disposed over the device layer 303, and the gate region 353 is disposed over the gate oxide region 352.

The illustrated MOS capacitor 350 includes a first halo or pocket implant 355a and a second halo or pocket implant 355b. Certain manufacturing processes include halo implantation to control transistor performance for relatively small gate lengths, such as gate lengths of 50 nm or less. For instance, halo implants can be used to limit an amount of diffusion of source and/or drain regions underneath edges of a gate during high temperature processes associated with semiconductor fabrication. Absent inclusion of halo implants, source and drain regions may diffuse unduly close to one another. For example, the source and drain regions may diffuse to provide a relatively short channel length that is susceptible to punch through at low drain-to-source voltage ($V_{DS}$) voltage levels.

The halo implants can include a doping polarity that is opposite that of active regions associated with source and drain regions. For example, when active regions associated with source and drain regions are n-type, the halo implants can be p-type. Additionally, when active regions associated with source and drain regions are p-type, the halo implants can be n-type.

Figure 13B:
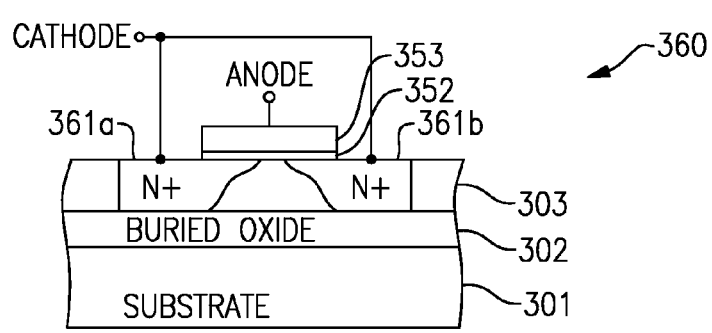
FIG. 13B is a cross section of a MOS capacitor according to another embodiment.

FIG. 13B is a cross section of a MOS capacitor 360 according to another embodiment. The MOS capacitor 360 of FIG. 13B is similar to the MOS capacitor 350 of FIG. 13A, except that the MOS capacitor 360 omits the first and second halo regions 355a, 355b of FIG. 13A.

Configuring the MOS capacitor 360 in this manner can result in a relatively large amount of diffusion of the source and drain regions 351a, 351b. However, in the illustrated configuration, the source and drain regions 351a, 351b are electrically connected to one another and operate as a cathode. Thus, the MOS capacitor 360 can remain operable even when the source and drain regions 351a, 351b diffuse relatively close to one another and/or diffuse into one another.

In certain embodiments, a MOS capacitor fabricated without halo or pocket implants can exhibit higher Q-factor and/or smaller capacitance variation in the presence of RF signals relative to a configuration in which the pocket implants are included.

Although FIGS. 13A and 13B illustrate MOS capacitors in context of an SOI process, the teachings herein are applicable to MOS capacitors fabricated using a wide range of processing technologies, including, for example, CMOS processes.

Terms such as above, below, over and so on as used herein refer to a device orientated as shown in the figures and should be construed accordingly. It should also be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Applications

Some of the embodiments described above have provided examples in connection with programmable duplexers. However, the principles and advantages of the embodiments can be used in other suitable systems or apparatus.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An integrated circuit comprising:
   a first radio frequency (RF) input and a second RF input;
   a first RF output and a second RF output;
   a first variable capacitor array electrically connected in a first signal path between the first RF input and the first RF output, wherein the first variable capacitor array comprises a first plurality of metal oxide semiconductor (MOS) capacitors, wherein a first MOS capacitor of the first plurality of MOS capacitors comprises:
      a gate that operates as an anode of the first MOS capacitor; and
      a source region and a drain region spaced apart from one another, wherein the source region is electrically connected to the drain region, wherein the source region and the drain region operate as a cathode of the first MOS capacitor,
      wherein the first MOS capacitor does not include any halo implant regions adjacent to the source region or to the drain region; and
   a second variable capacitor array electrically connected in a second signal path between the second RF input and the second RF output, wherein the second variable capacitor array comprises a second plurality of MOS capacitors.

2. The integrated circuit of claim 1, wherein a second MOS capacitor of the first plurality of MOS capacitors comprises:
   a gate that operates as an anode of the second MOS capacitor; and
   a source region and a drain region electrically connected to one another, wherein the source region and the drain region of the second MOS capacitor operate as a cathode of the second MOS capacitor,
   wherein the second MOS capacitor does not include any halo implant regions adjacent to the source region or to the drain region of the second MOS capacitor.

3. The integrated circuit of claim 2, wherein the first and second MOS capacitors are electrically connected in anti-series, wherein the anode of the first MOS capacitor is electrically connected to the anode of the second MOS capacitor.

4. The integrated circuit of claim 2, wherein the first and second MOS capacitors are electrically connected in anti-series, wherein the cathode of the first MOS capacitor is electrically connected to the cathode of the second MOS capacitor.

5. The integrated circuit of claim 2, wherein the first and second MOS capacitors are electrically connected in anti-parallel, wherein the anode of the first MOS capacitor is electrically connected to the cathode of the second MOS capacitor, and wherein the cathode of the first MOS capacitor is electrically connected to the anode of the second MOS capacitor.

6. The integrated circuit of claim 1, further comprising a bias voltage generation circuit configured to bias the first plurality of MOS capacitors including the first MOS capacitor, wherein the bias voltage generation circuit is configured to bias the first MOS capacitor with a first bias voltage.

7. The integrated circuit of claim 6, wherein the bias voltage generation circuit is configured to control the first bias voltage to a voltage level selected from a discrete number of two or more bias voltage levels.

8. The integrated circuit of claim 7, wherein the bias voltage generation circuit is configured to control the first bias voltage to either a first bias voltage level that biases the first MOS capacitor in an accumulation mode or to a second bias voltage level that biases the first MOS capacitor in an inversion mode.

9. The integrated circuit of claim 1, wherein the integrated circuit is in a silicon on insulator (SOI) substrate.

10. The integrated circuit of claim 1, wherein a portion of the source region extends underneath a gate corner at a first side of the gate, and wherein a portion of the drain region extends underneath a gate corner at a second side of the gate opposite the first side of the gate.

11. The integrated circuit of claim 1, wherein the drain region comprises a first N+ region, wherein the source region comprises a second N+ region, wherein the first MOS capacitor does not comprise any P+ halo regions between the first and second N+ regions.

12. The integrated circuit of claim 1, wherein each MOS capacitor of the first plurality of MOS capacitors does not include any halo implant regions.

13. The integrated circuit of claim 12, wherein each MOS capacitor of the second plurality of MOS capacitors does not include any halo implant regions.

14. The integrated circuit of claim 1, further comprising: a third RF input, a third RF output, and a third variable capacitor array electrically connected in a third signal path between the third RF input and the third RF output, wherein the third variable capacitor array comprises a third plurality of MOS capacitors.

15. An apparatus comprising:
a first radio frequency (RF) input and a second RF input;
a first RF output and a second RF output;
an RF circuit comprising a plurality of variable capacitor arrays configured to provide frequency tuning to the RF circuit,
wherein a first variable capacitor array of the plurality of variable capacitor arrays comprises a first plurality of metal oxide semiconductor (MOS) capacitors and is electrically connected in a first signal path between the first RF input and the first RF output, wherein a first MOS capacitor of the first plurality of MOS capacitors comprises:
a gate electrode that operates as an anode of the first MOS capacitor;
a first region and a second region beneath the gate electrode, the first and second regions laterally spaced from one another, the first and second regions being heavily doped regions of a first conductivity type, the first and second regions being electrically shorted to one another to operate as a cathode of the first MOS capacitor, the first and second regions having no heavily doped regions of a second conductivity type therebetween, the second conductivity type being opposite the first conductivity type; and
wherein a second variable capacitor array of the plurality of variable capacitor arrays comprises a second plurality of MOS capacitors and is electrically connected in a second signal path between the second RF input and the second RF output.

16. The apparatus of claim 15, wherein the RF circuit comprises a programmable filter, wherein the variable capacitor array is configured to control a location in frequency of a passband of the programmable filter.

17. The apparatus of claim 15, further comprising:
a buried oxide (BOX) layer; and
a device layer over the BOX layer, wherein the device layer comprises the first plurality of MOS capacitors.

18. The apparatus of claim 15, wherein a second MOS capacitor of the first plurality of MOS capacitors is electrically connected with the first MOS capacitor in anti-series.

19. The apparatus of claim 15, wherein a second MOS capacitor of the first plurality of MOS capacitors is electrically connected with the first MOS capacitor in anti-parallel.

20. The apparatus of claim 15, wherein each MOS capacitor of the first plurality of MOS capacitors does not include any halo implant regions.

21. The apparatus of claim 20, wherein each MOS capacitor of the second plurality of MOS capacitors does not include any halo implant regions.

22. The apparatus of claim 15, further comprising: a third RF input, a third RF output, and a third variable capacitor array electrically connected in a third signal path between the third RF input and the third RF output, wherein the third variable capacitor array comprises a third plurality of MOS capacitors.

23. An integrated circuit:
a first radio frequency (RF) input and a second RF input;
a first RF output and a second RF output;
a first variable capacitor array electrically connected in a first signal path between the first RF input and the first RF output, wherein the first variable capacitor array comprises a first plurality of metal oxide semiconductor (MOS) capacitors, wherein a first MOS capacitor of the first plurality of MOS capacitors comprises:
a source region comprising a first heavily doped region of a first conductivity type;
a drain region comprising a second heavily doped region of the first conductivity type;
a channel region positioned between the source region and the drain region and of a second conductivity type opposite the first conductivity type, wherein the source region is spaced from the drain region by the channel region with no intervening heavily doped regions of the second conductivity type;
a gate oxide region over the channel region; and
a gate electrode over the gate oxide region; and
a second variable capacitor array electrically connected in a second signal path between the second RF input and the second RF output, wherein the second variable capacitor array comprises a second plurality of MOS capacitors.

24. The integrated circuit of claim 23, wherein the source region extends down to an oxide layer, wherein the drain region extends down to the oxide layer.

25. The integrated circuit of claim 23, further comprising a bias voltage generation circuit configured to bias the first plurality of MOS capacitors including the first MOS capacitor, wherein the bias voltage generation circuit is configured to bias the first MOS capacitor with a first bias voltage.

26. The integrated circuit of claim 25, wherein the bias voltage generation circuit is configured to control the first bias voltage to either a first bias voltage level that biases the first MOS capacitor in an accumulation mode or to a second bias voltage level that biases the first MOS capacitor in an inversion mode.

27. The integrated circuit of claim 23, wherein each MOS capacitor of the first plurality of MOS capacitors does not include any halo implant regions.

28. The integrated circuit of claim 27, wherein each MOS capacitor of the second plurality of MOS capacitors does not include any halo implant regions.

29. The integrated circuit of claim 23, further comprising:
a third RF input, a third RF output, and a third variable capacitor array electrically connected in a third signal path between the third RF input and the third RF output, wherein the third variable capacitor array comprises a third plurality of MOS capacitors.

* * * * *